US008111798B2

(12) United States Patent
Sai

(10) Patent No.: US 8,111,798 B2
(45) Date of Patent: Feb. 7, 2012

(54) PHASE SYNCHRONIZATION CIRCUIT AND RECEIVER HAVING THE SAME

(75) Inventor: Akihide Sai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 541 days.

(21) Appl. No.: 12/368,684

(22) Filed: Feb. 10, 2009

(65) Prior Publication Data

US 2009/0207961 A1 Aug. 20, 2009

(30) Foreign Application Priority Data

Feb. 14, 2008 (JP) ................................. 2008-032821

(51) Int. Cl.
*H03D 3/24* (2006.01)
(52) U.S. Cl. ........................................ 375/375; 327/156
(58) Field of Classification Search .................. 327/156; 331/10; 375/354, 373, 375, 376
See application file for complete search history.

(56) References Cited

U.S. PATENT DOCUMENTS

| 7,266,170 B2 * | 9/2007 | Matsunami et al. .......... 375/376 |
| 2003/0076139 A1 * | 4/2003 | Miyagawa et al. ........... 327/156 |
| 2004/0207437 A1 * | 10/2004 | Shibahara et al. ............ 327/156 |

FOREIGN PATENT DOCUMENTS

| JP | 08-079066 | 3/1996 |
| JP | 2004-312726 | 11/2004 |
| JP | 2004-357076 | 12/2004 |

OTHER PUBLICATIONS

Staszewski, et al, All Digital PLL and Transmitter for Mobile Phones, IEEE Journal of Solid-State Circuits, vol. 40, No. 12, Dec. 2005.

* cited by examiner

*Primary Examiner* — David C. Payne
*Assistant Examiner* — Leon-Viet Nguyen
(74) *Attorney, Agent, or Firm* — Turocy & Watson, LLP

(57) ABSTRACT

A phase synchronization circuit includes a controlled oscillator configured to generate a first oscillation signal and a second oscillation signal that have a common frequency but different phase controlled by a combination of a first control signal and a second control signal, a digital phase frequency detector configured to detect a frequency difference and a first phase difference between a reference signal and the first oscillation signal to generate the first control signal, an analog phase detector configured to detect a second phase difference between the second oscillation signal and the reference signal to generate the second control signal, and a lock detection unit configured to detect a lock of the first oscillation signal with the reference signal in terms of frequency and phase, in order to set the analog phase detector in an active state.

17 Claims, 25 Drawing Sheets

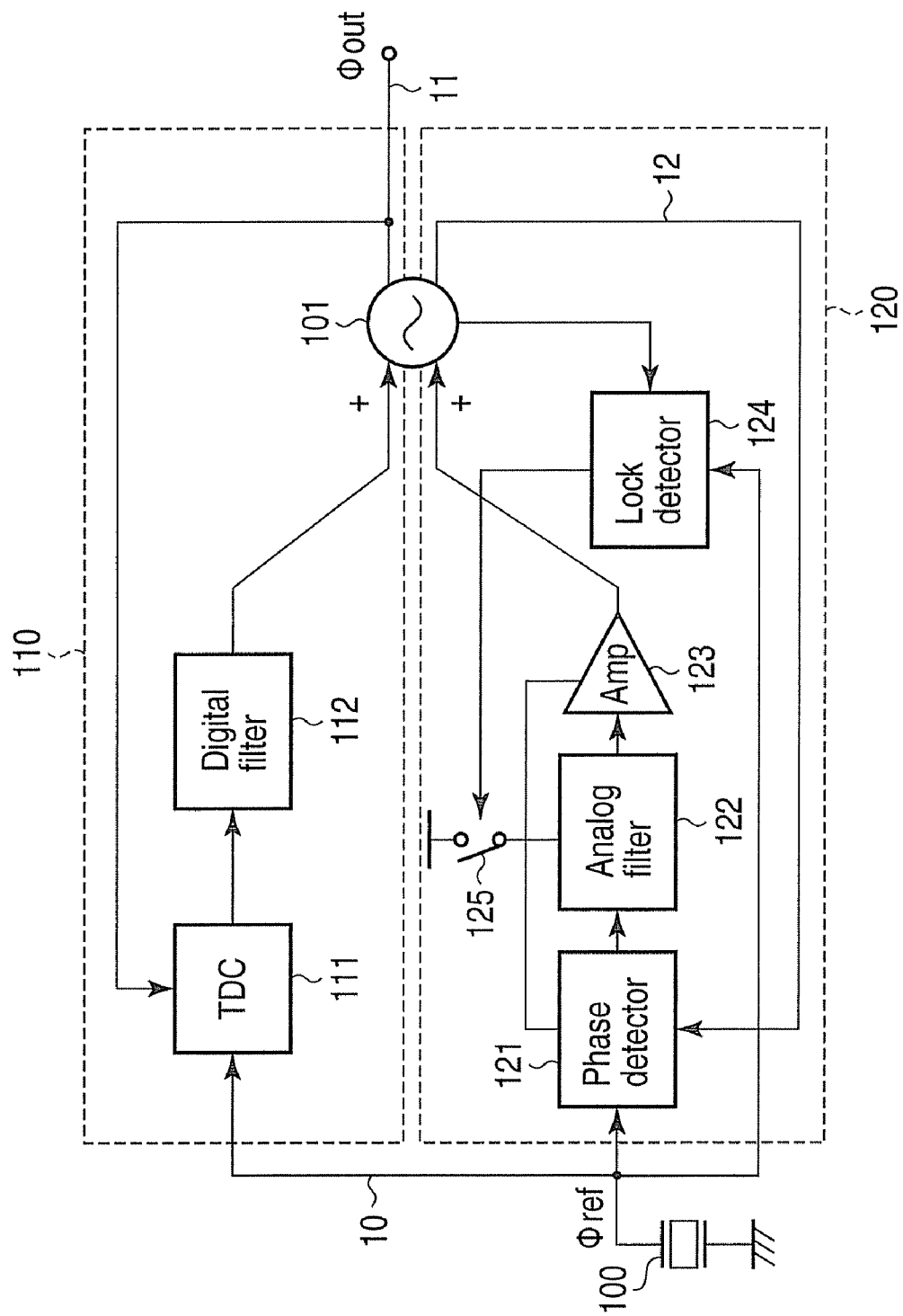
F I G. 1

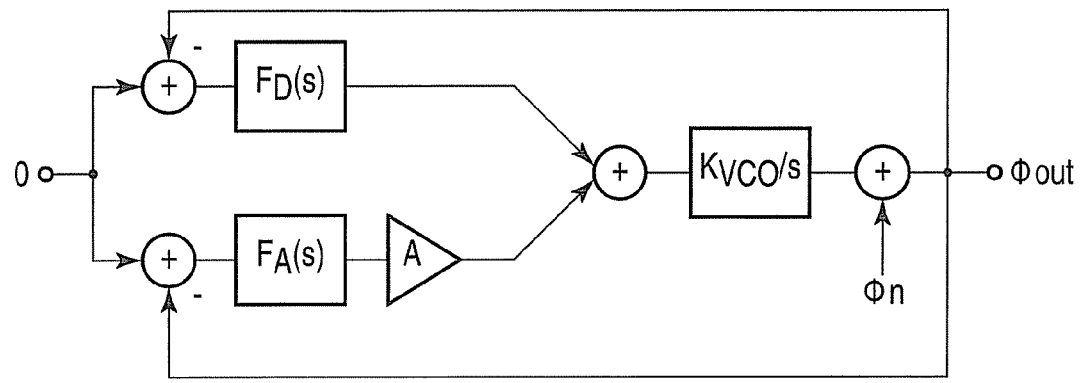
F I G. 8
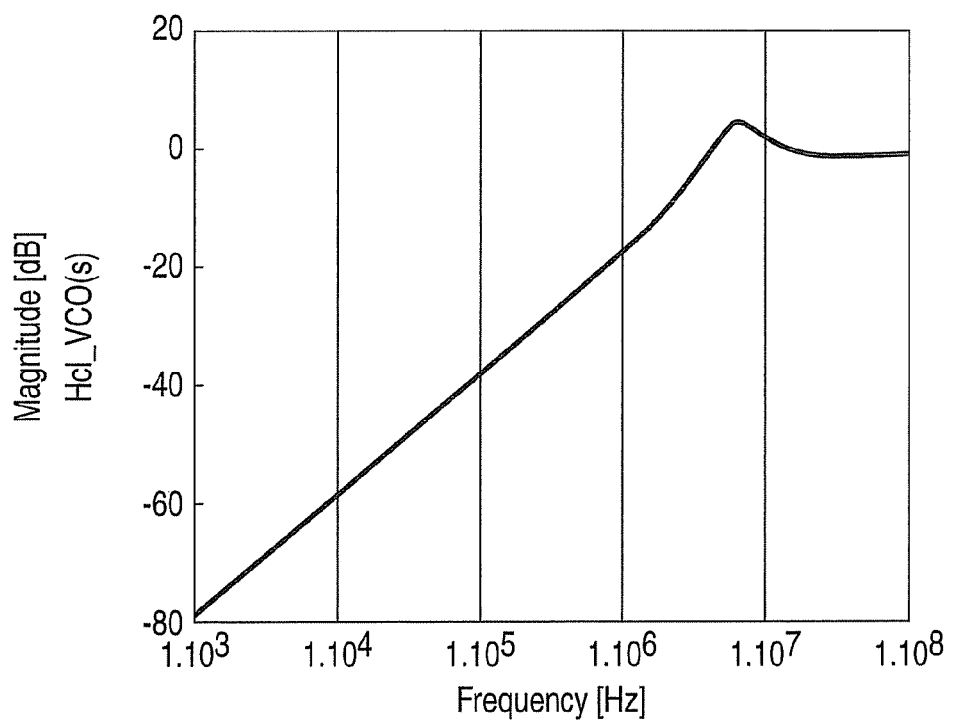
F I G. 9

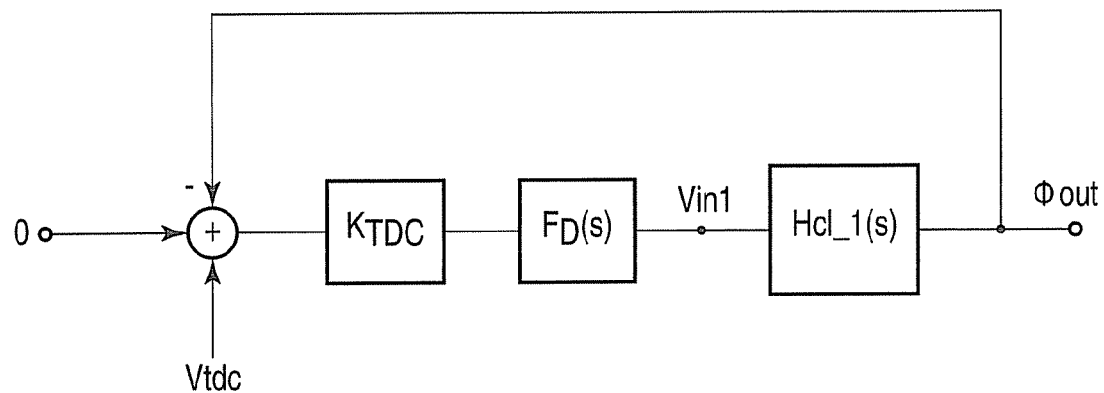
F I G. 10
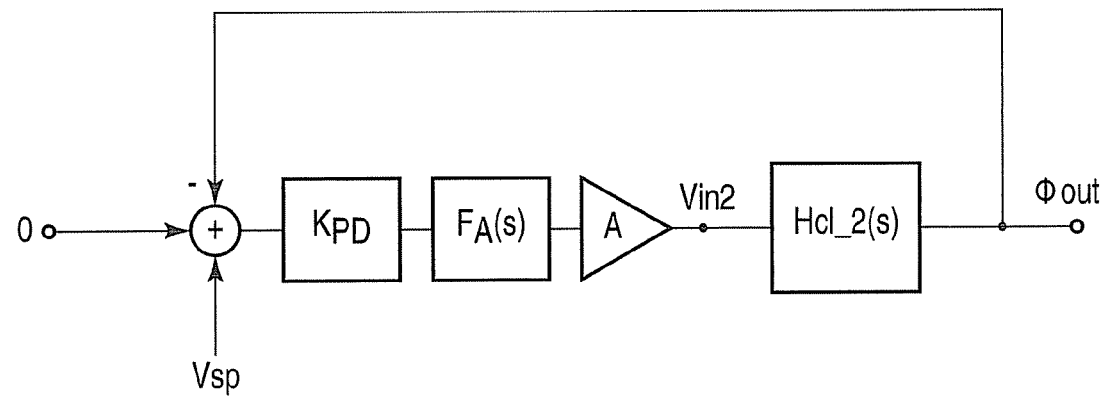
F I G. 11

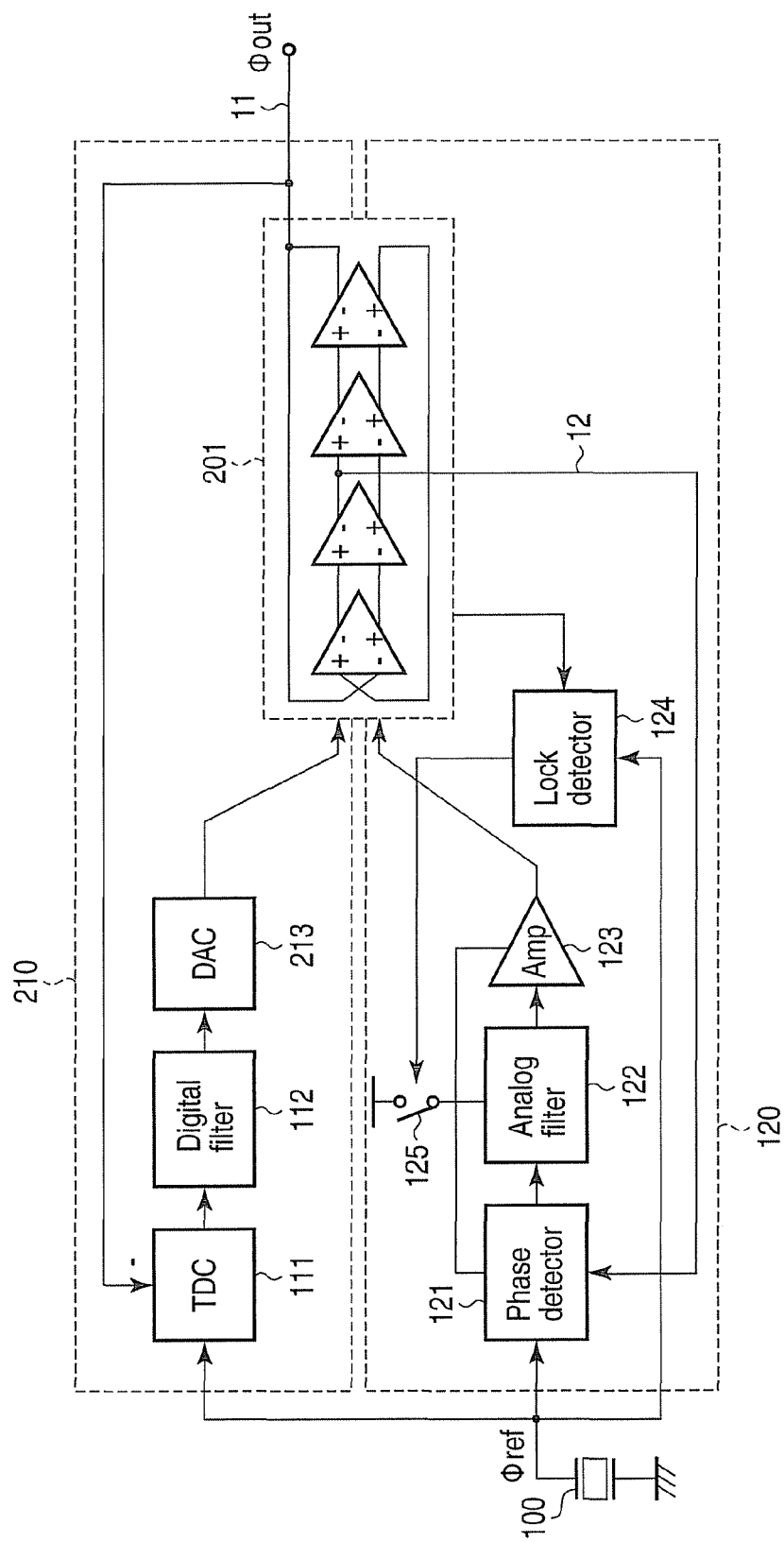
F I G. 14

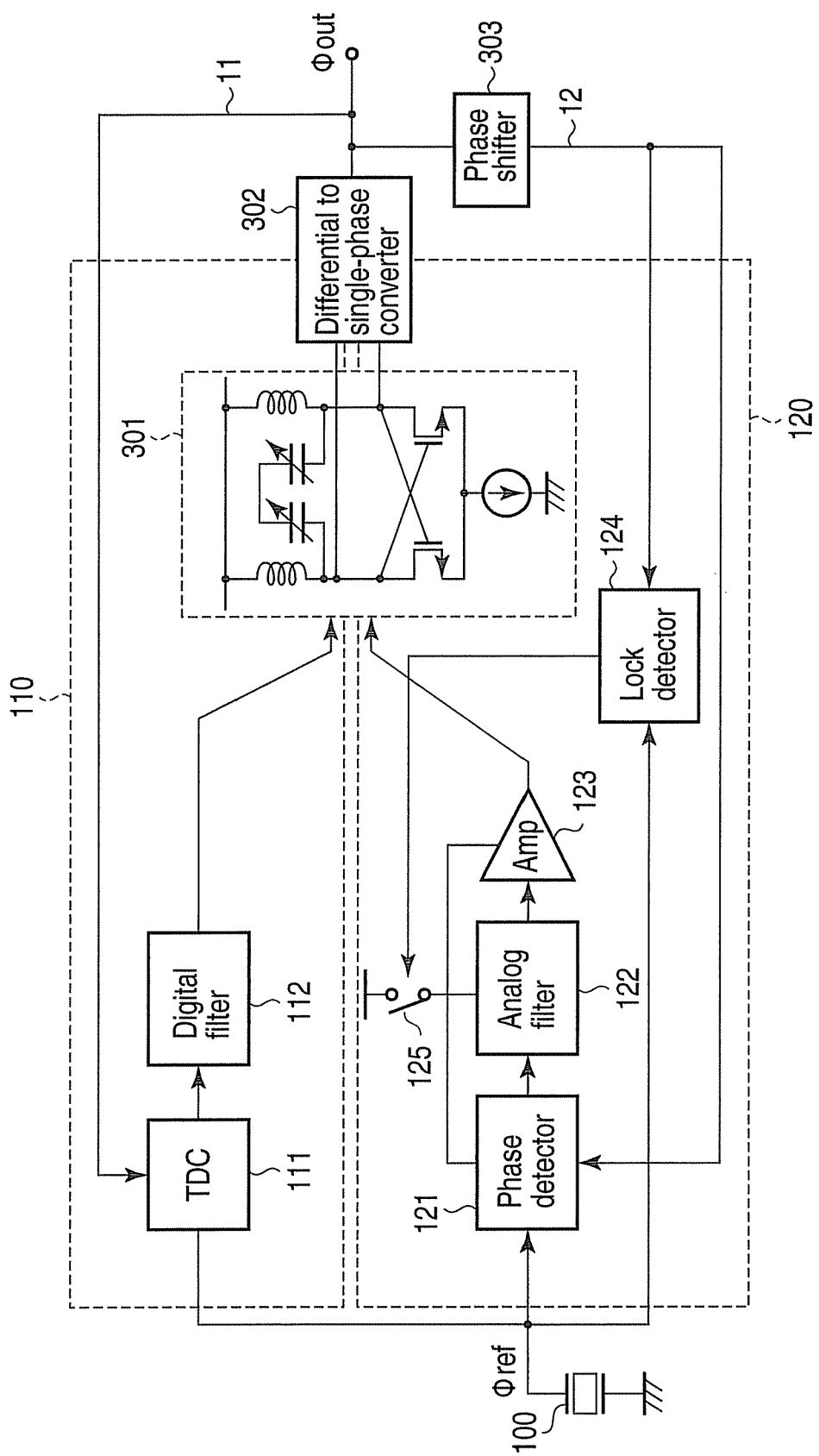
F I G. 15

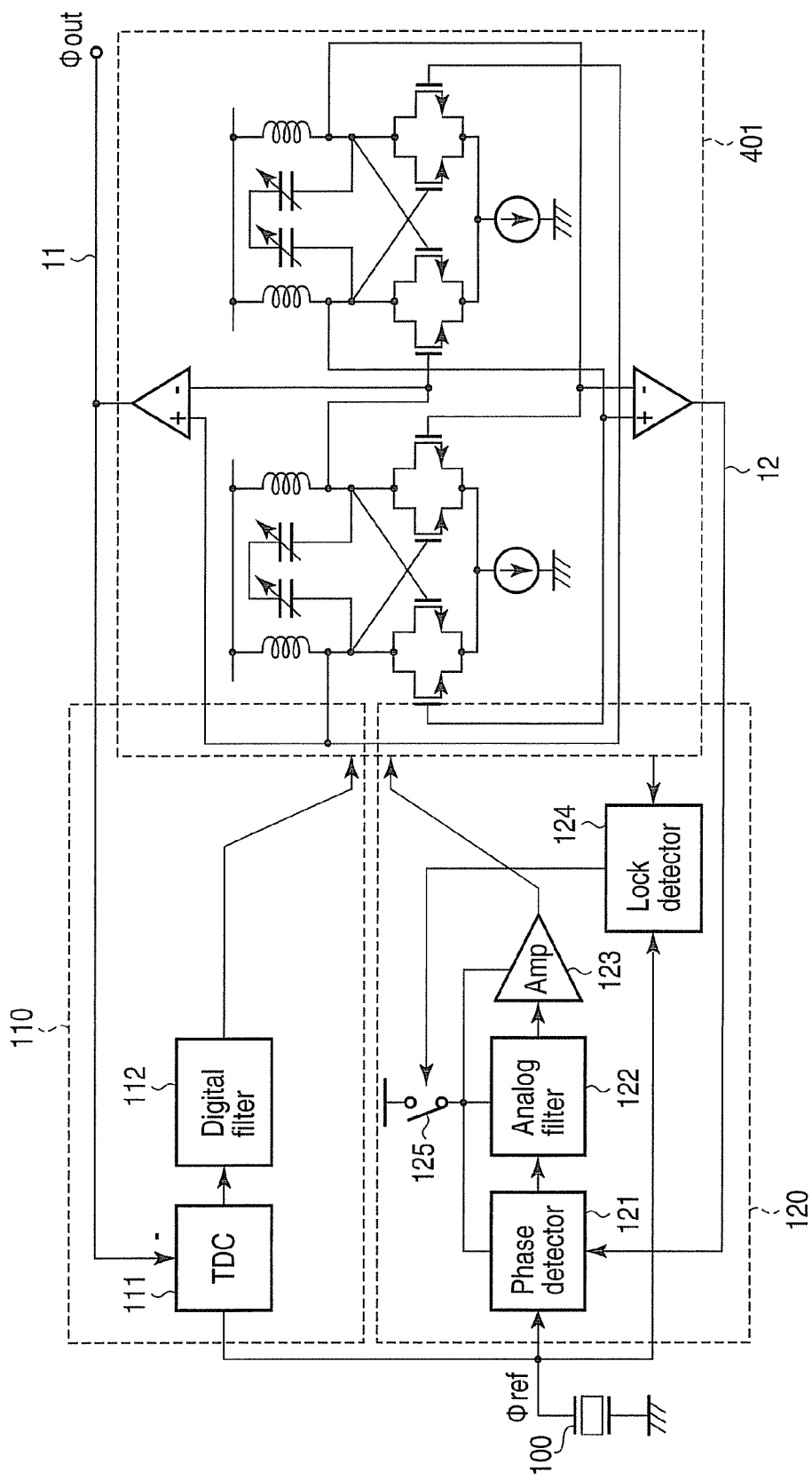
F I G. 16

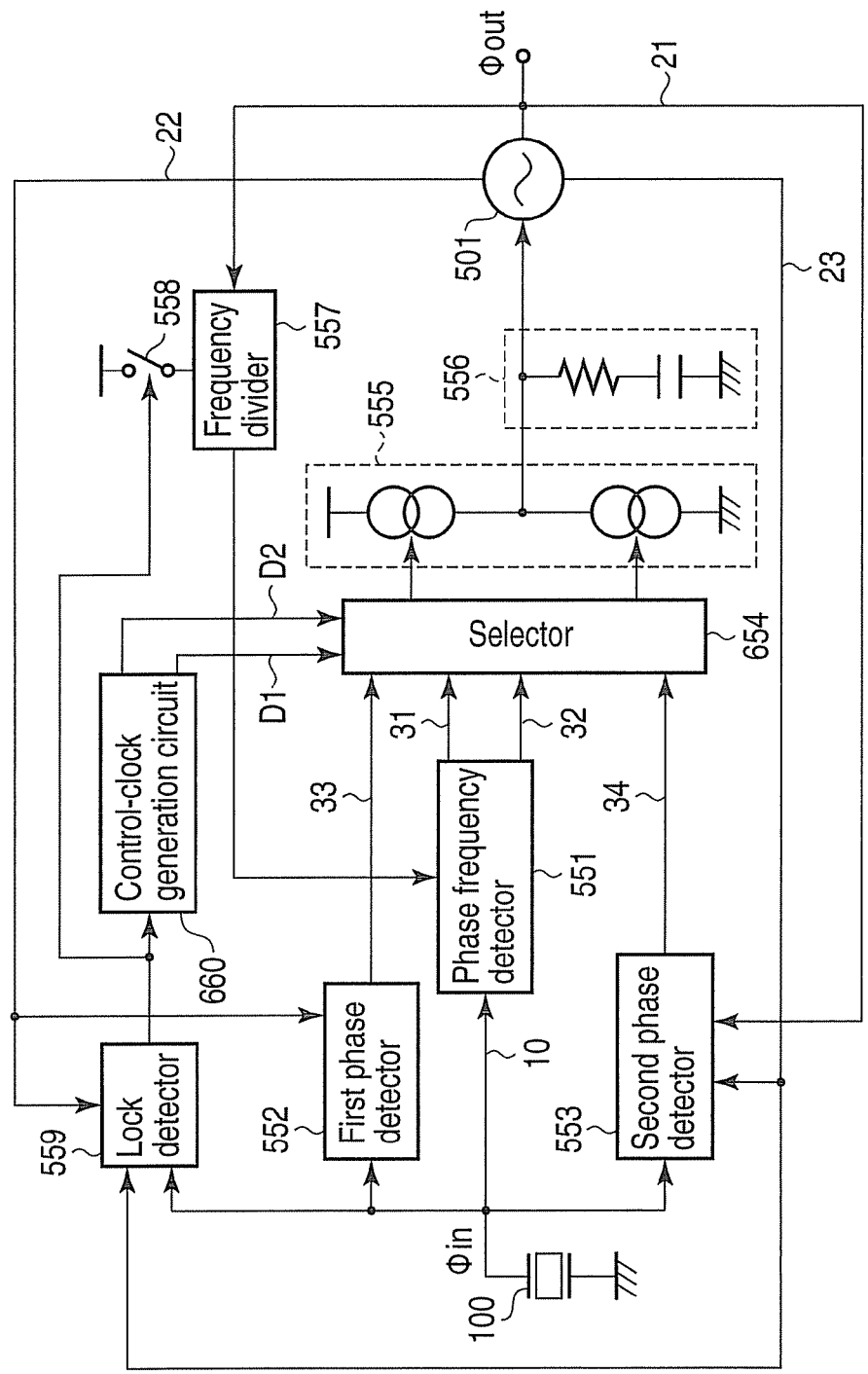
F I G. 21

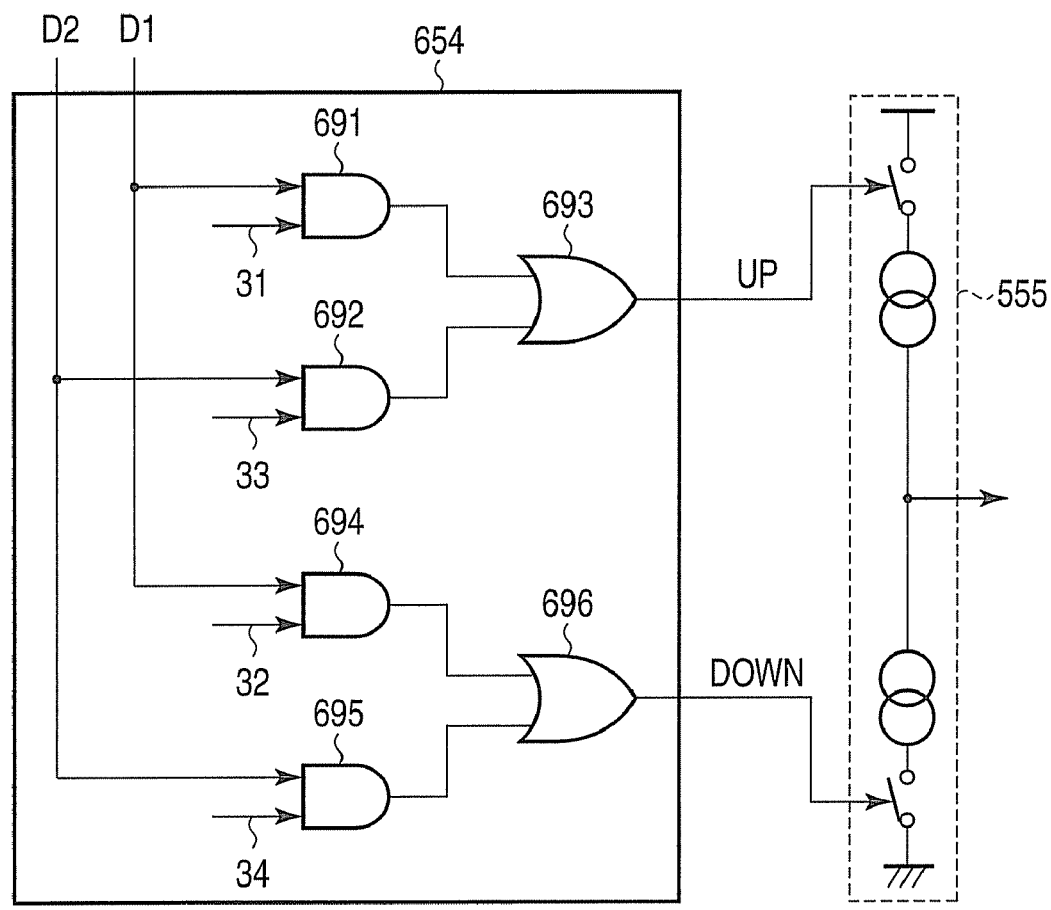
F I G. 23

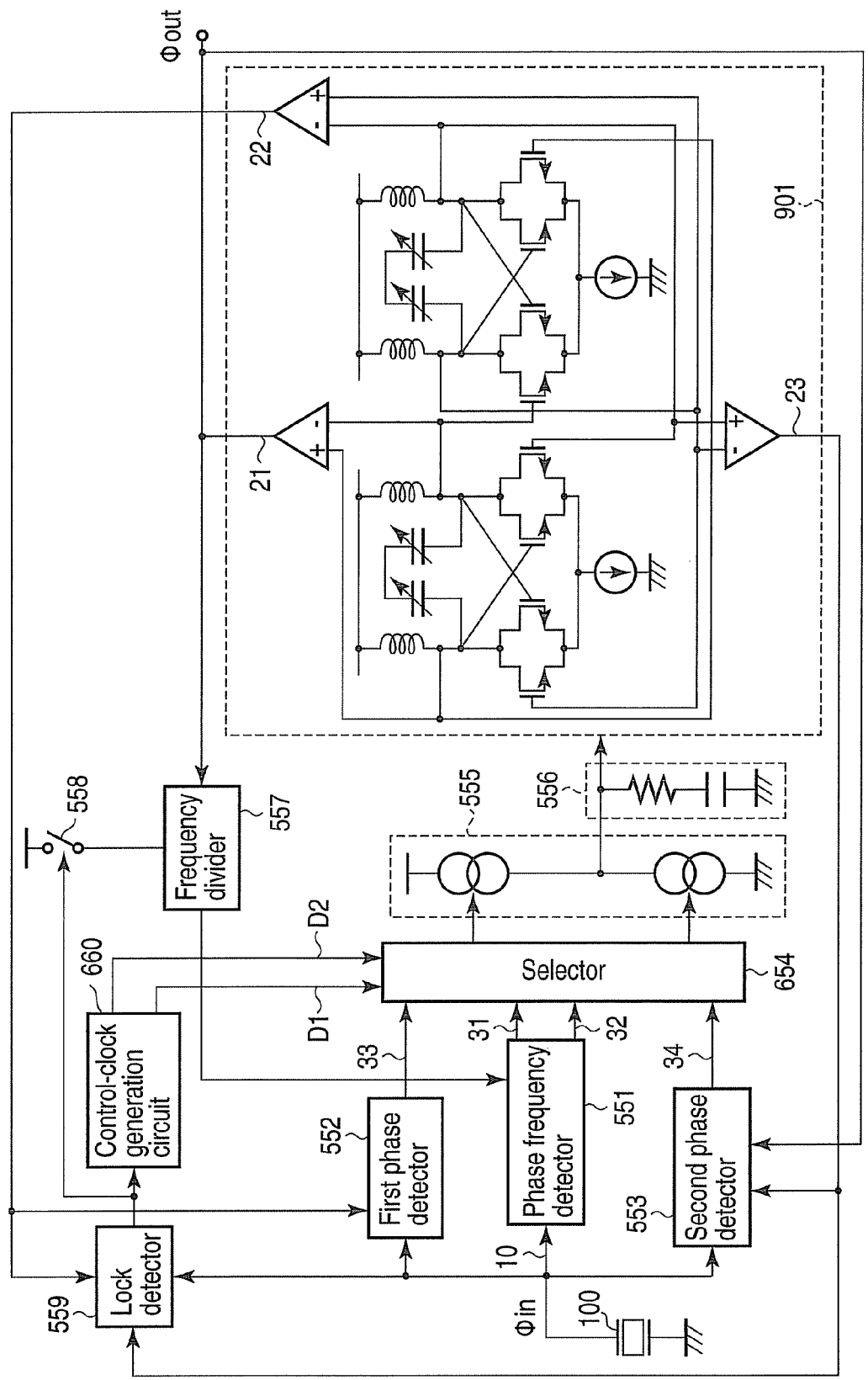
F I G. 26

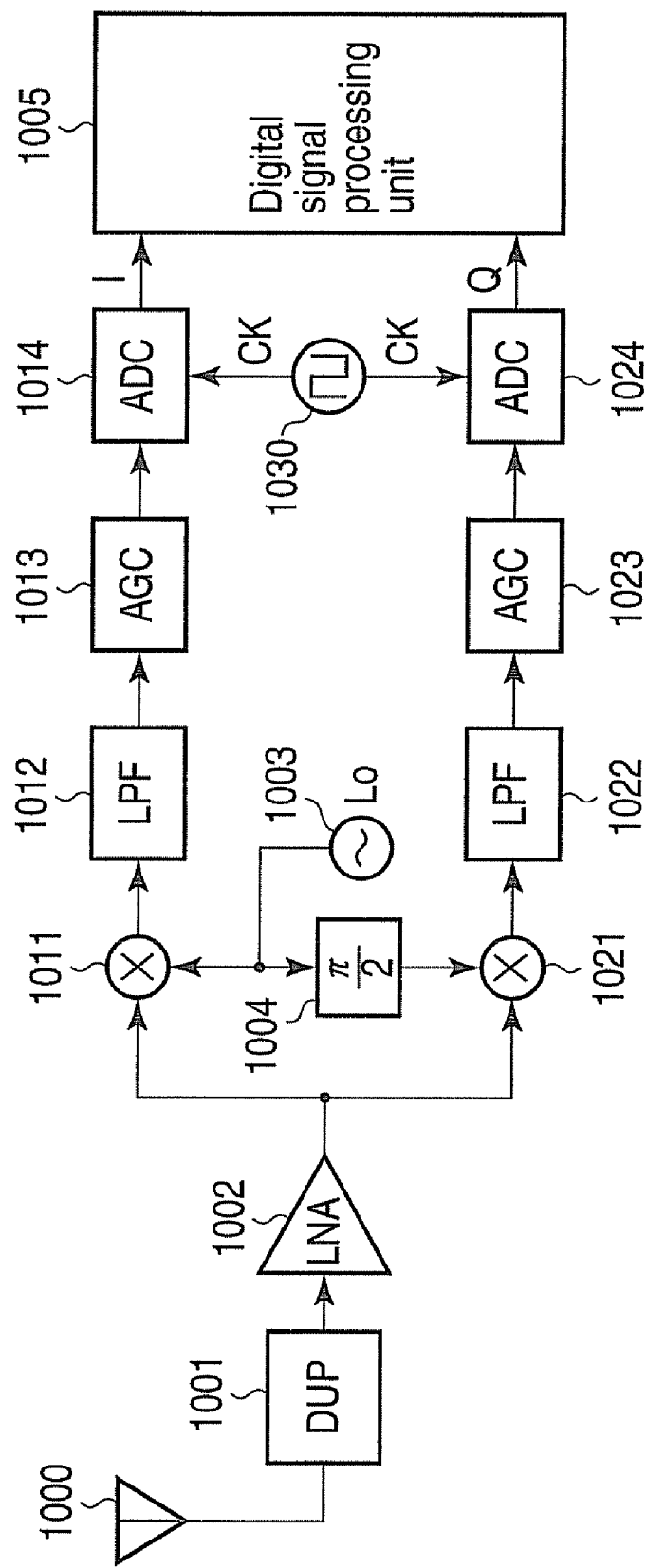
F I G. 27

PHASE SYNCHRONIZATION CIRCUIT AND RECEIVER HAVING THE SAME

CROSS-REFERENCE TO RELATED APPLICATIONS

This application is based upon and claims the benefit of priority from prior Japanese Patent Application No. 2008-032821, filed Feb. 14, 2008, the entire contents of which are incorporated herein by reference.

BACKGROUND OF THE INVENTION

1. Field of the Invention

The present invention relates to a phase synchronization circuit that generates an output signal synchronous with a reference signal in both frequency and phase, and to a receiver that incorporates this phase synchronization circuit.

2. Description of the Related Art

Phase synchronization circuits that can generate an output signal synchronous with a reference signal in frequency and phase are well known as phase locked loops (PLLs). An exemplary PLL includes a voltage-controlled oscillator (VCO), a phase detector, an analog filter, and an amplifier. The VCO has its oscillation frequency controlled by the control voltage applied to it. The phase detector detects the phase difference between the reference signal and the output signal of the VCO. The analog filter suppresses unnecessary waves of the output signal of the phase detector. The amplifier amplifies the output signal of the analog filter, producing an output signal.

The PLL is not limited to an analog type. It may be a digital type. R. Staszewski, "All-Digital PLL and Transmitter for Mobile Phones", IEEE J. of Solid-State Circuits Vol. 40, No. 12, December 2005 (hereinafter referred to as "related art") discloses a digital PLL. This digital PLL includes a VCO, a time-to-digital converter (TDC), a digital filter, and a digital-to-analog converter (DAC). The TDC detects the frequency difference and phase difference between the reference signal and the output signal of the VCO, and output a digital detection signal based on the frequency difference and phase difference. The digital filter suppresses unnecessary waves of the digital detection signal. The DAC converts the output signal of the digital filter to an analog voltage, which controls the VCO. In many analog PLL, the analog filter has an external capacitor. In many digital PLL, not an analog filter, but an on-chip digital filter is used. The digital PLL can therefore be configured to have a smaller area than the analog PLL.

However, the TDC generates quantization noise, however. This is inevitable, because the TDC converts the frequency difference and phase difference to a digital detection signal. Since its resolution is limited, the TDC generates quantization noise equivalent to one least significant bit (LSB) even if the PLL is locked (synchronized) condition. The transfer function valid until the PLL outputs the quantization noise is a low-pass type, and the cut-off frequency depends on the loop band. On the other hand, the transfer function valid until the PLL outputs the phase noise the VCO produces is a high-pass type, and the cut-off frequency depends on the loop band. Hence, if the loop band is set to a narrow one in order to suppress the quantization noise, the phase noise of the VCO will hardly be suppressed. Conversely, if the loop band is set to a wide one in order to suppress the phase noise of the VCO, the quantization noise will hardly be suppressed.

JP-A 2004-312726 (KOKAI) describes a double-loop PLL that comprises a digital loop and an analog loop for achieving frequency synchronization and phase synchronization, respectively. In the PLL described in JP-A 2004-312726 (KOKAI), the digital loop has a relatively narrow band, removing quantization noise, whereas the band of the analog loop is relatively wide, removing the phase noise of the VCO.

Any PLL incorporates a phase detector or a phase frequency detector, one of which cannot phase differences smaller than a specific lower limit. The range of phase difference, over which the phase detector cannot detect phase differences, is called the "dead zone." The dead zone results from the logic delay inherent to the phase detector, and may degrade the phase-noise characteristic of the entire PLL.

JP-A 2004-357076 (KOKAI) describes the circuit configuration of a phase detector designed to avoid the occurrence of a dead zone. In the circuit configuration described in JP-A 2004-357076 (KOKAI), two phase frequency comparators and a plurality of inverters (delay elements) are so combined that the phase difference between the reference signal and the output signal of the VCO may be detected even if they coincide in phase(i.e. the phase difference=0 ).

The double-loop PLL described in JP-A 2004-312726 (KOKAI) is similar to the conventional PLL in that the analog loop performs the phase synchronization. Therefore, the loop band cannot be widened over the maximum value (e.g., 1/10 of the reference signal frequency) possible with the conventional PLL. Further, in this PLL an external capacitor must be used to constitute an analog filter, in order to attain high capacitance. Consequently, the area of the circuit can hardly be reduced, as in the conventional analog-type PLL.

Moreover, the phase detector described in JP-A 2004-357076 (KOKAI) needs to have more delay elements than the ordinary phase detector. The delays these delay elements provide lower the operating stability, i.e., phase margin, of the PLL incorporating the phase detector. To make the matters worse, the reference signal may be superposed with noise, because it is delayed by a plurality of inverters. Further, some margin must be applied to the delay of the reference signal, in view of the process variation, the fluctuation of the power-supply voltage and the temperature dependency of the parameters of the circuit components. The phase detector described in JP-A 2004-357076 (KOKAI) is therefore disadvantageous in terms of power consumption and circuit area, with respect to the entire chip.

BRIEF SUMMARY OF THE INVENTION

According to an aspect of the invention, there is provided a phase synchronization circuit comprising: a controlled oscillator configured to generate a first oscillation signal and a second oscillation signal that have a common frequency but different phase controlled by a combination of a first control signal and a second control signal; a digital phase frequency detector configured to detect a frequency difference and a first phase difference between a reference signal and the first oscillation signal to generate a first detection signal that accords with the frequency difference and the first phase difference; a digital filter configured to suppress high-frequency components of the first detection signal to obtain the first control signal; an analog phase detector configured to detect a second phase difference between the second oscillation signal and the reference signal to generate a second detection signal that accords with the second phase difference; an analog filter configured to perform a filtering process to suppress high-frequency components of the second detection signal to obtain a filtered signal; an amplifier configured to amplify the filtered signal to obtain the second control signal; and a lock detection unit configured to detect a lock of the first oscillation signal with the reference signal in terms of frequency and phase, in order to set the analog phase detector, the analog filter and the amplifier in an active state.

According to another aspect of the invention, there is provided a phase synchronization circuit comprising: a ring oscillator configured to generate a first oscillation signal and a second oscillation signal that have a common frequency but different phase controlled by a combination of a first control signal and a second control signal; a digital phase frequency detector configured to detect a frequency difference and a first phase difference between a reference signal and the first oscillation signal to generate a first detection signal that accords with the frequency difference and the first phase difference; a digital filter configured to suppress high-frequency components of the first detection signal to obtain a first filtered signal; a digital-to-analog converter configured to convert the first filtered signal to an analog signal to obtain the first control signal; an analog phase detector configured to detect a second phase difference between the second oscillation signal and the reference signal to generate a second detection signal that accords with the second phase difference; an analog filter configured to perform a filtering process to suppress high-frequency components of the second detection signal to obtain a second filtered signal; an amplifier configured to amplify the second filtered signal to obtain the second control signal; and a lock detection unit configured to detect a lock of the first oscillation signal with the reference signal in terms of frequency and phase, in order to set the analog phase detector, the analog filter and the amplifier in an active state.

According to another aspect of the invention, there is provided a phase synchronization circuit comprising: a controlled oscillator configured to generate a first oscillation signal having a frequency controlled by a combination of a first control signal and a second control signal; a phase shifter configured to shift the first oscillation signal in terms of phase to obtain a second oscillation signal; a digital phase frequency detector configured to detect a frequency difference and a first phase difference between the first oscillation signal and a reference signal to generate a first detection signal that accords with the frequency difference and the first phase difference; a digital filter configured to perform a filtering process to suppress high-frequency components of the first detection signal to obtain the first control signal; an analog phase detector configured to detect a second phase difference between the second oscillation signal and the reference signal to generate a second detection signal that accords with the second phase difference; an analog filter configured to perform a filtering process to suppress high-frequency components of the second detection signal to obtain a filtered signal; an amplifier configured to amplify the filtered signal to obtain the second control signal; and a lock detection unit configured to detect a lock of the first oscillation signal with the reference signal in terms of frequency and phase, in order to set the analog phase detector, the analog filter and the amplifier in an active state.

According to another aspect of the invention, there is provided a phase synchronization circuit comprising: a controlled oscillator configured to generate a first oscillation signal and a second oscillation signal that have a common frequency but different phase controlled by a control signal; a lock detection unit configured to detect whether a reference signal and the first oscillation signal are in lock condition or unlocked condition; a frequency divider configured to frequency-divide the first oscillation signal in the unlocked condition to obtain a frequency-divided signal; a phase frequency detector configured to detect a frequency difference and a first phase difference between the reference signal and the fre-quency-divided signal to generate a first detection signal that accords with the frequency difference and the first phase difference; a phase detector configured to detect a second phase difference between the second oscillation signal and the reference signal to generate a second detection signal that accords with the second phase difference; a selector configured to select the first detection signal in the unlocked condition and to select the second detection signal in the locked condition in order to obtain a selected detection signal; and a filter configured to perform a filtering process to suppress high-frequency components of the selected detection signal to obtain the control signal.

BRIEF DESCRIPTION OF THE SEVERAL VIEWS OF THE DRAWING

FIG. 1 is a block diagram showing a phase synchronization circuit according to a first embodiment;

FIG. 8 is a diagram showing a transfer model of the phase noise generated in the controlled oscillator shown in FIG. 1;

FIG. 9 is a graph representing the gain characteristic of the transfer function for the phase noise generated in the controlled oscillator shown in FIG. 1;

FIG. 10 is a diagram illustrating a transfer model of the quantization noise generated in the digital loop shown in FIG. 1;

FIG. 11 is a diagram illustrating a transfer model of the reference-signal spurious generated in the analog loop shown in FIG. 1;

FIG. 14 is a block diagram showing a phase synchronization circuit according to a second embodiment;

FIG. 15 is a block diagram showing a phase synchronization circuit according to a third embodiment;

FIG. 16 is a block diagram showing a phase synchronization circuit according to a fourth embodiment;

FIG. 21 is a block diagram showing a phase synchronization circuit according to a sixth embodiment;

FIG. 23 is a circuit diagram showing an example of the selector shown in FIG. 21, and an example of the charge pump shown in FIG. 21;

FIG. 26 is a block diagram showing a phase synchronization circuit according to a ninth seventh embodiment; and FIG. 27 is a block diagram showing a receiver according to a tenth embodiment.

DETAILED DESCRIPTION OF THE INVENTION

Figure 2A:
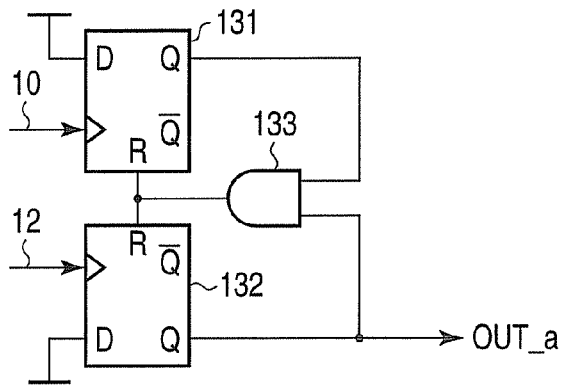
FIG. 2A is a circuit diagram showing an example of the phase detector shown in FIG. 1.

Embodiments of this invention will be will be described with reference to the accompanying drawings.

First Embodiment

As FIG. 1 shows, a phase synchronization circuit according to a first embodiment of the invention has a reference signal generator 100, a controlled oscillator 101, a TDC 111, a digital filter 112, a phase detector 121, an analog filter 122, an amplifier 123, a lock detector 124, and a switch 125.

In the phase synchronization circuit of FIG. 1, the controlled oscillator 101, TDC 111 and digital filter 112 constitute a digital loop 110. The controlled oscillator 101, phase detector 121, analog filter 122 and amplifier 123 constitute an analog loop 120. The digital loop 110 locks the frequency and phase of the output signal of the controlled oscillator 101 to the frequency and phase of the reference signal generated by the reference signal generator 100. Then the analog loop 120 suppresses the phase noise generated in the controlled oscillator 101.

The reference signal generator 100 is, for example, a crystal oscillator, and generates a reference signal 10. The reference signal 10 will be used as a target to lock in the phase synchronization circuit of FIG. 1. The reference signal 10 is input to the TDC 111, phase detector 121 and lock detector 124.

The digital filter 112 inputs a first control signal to the first control terminal of the controlled oscillator 101. The amplifier 123 inputs a second control signal to the second control terminal of the controlled oscillator 101. The controlled oscillator 101 outputs an oscillation signal having an oscillation frequency that accords with the combination of the first and second control signals. Assume that the controlled oscillator 101 outputs two oscillation signals 11 (phase signals) that differs in phase from each other. The first phase signal 11 is input to the TDC 111, and the second phase signal 12 is input to the phase detector 121.

The controlled oscillator 101 is, for example, a ring oscillator. Alternatively, the controlled oscillator 101 may be constituted by an LC oscillator and a phase shifter. In this case, the output of the LC oscillator is branched into two, and the phase shifter is connected to one of the branched outputs. Still alternatively, the controlled oscillator 101 may be an orthogonal oscillator that includes an LC oscillator.

The TDC 111 detects the frequency difference and phase difference between the reference signal 10 and the first phase signal 11 and generates a first detection signal that accords with the frequency difference and phase difference. The first detection signal is output to the digital filter 112. More precisely, as shown in the related art, the TDC 111 may be so configured to utilize inverter delay, thereby to convert a phase difference to a digital value.

The digital filter 112 suppresses unnecessary waves of the first detection signal output from the TDC 111 and then inputs the first control signal to the controlled oscillator 101. Controlled by the first controlled signal, the controlled oscillator 101 generates such first and second phase signals 11 and 12 as will reduce the frequency difference and phase difference between the reference signal 10 and the first phase signal 11. The frequency characteristic of the digital filter 112 influences the loop band width and lock-up time of the digital loop 110 and the phase-noise characteristic of the controlled oscillator 101. The digital filter 112 may be designed in consideration of the loop band width, lock-up time and phase-noise characteristic.

The lock detector 124 may detect that the frequency and phase of the first phase signal 11 are synchronized with (or locked to) those of the reference signal 10 in the digital loop 110. In this case, the lock detector 124 turns on the switch 125. The power-supply voltage (drive voltage) is thereby applied to the components of the analog loop 120. The analog loop 120 therefore starts operating.

In the analog loop 120, the phase detector 121 detects the phase difference between the reference signal 10 and the second phase signal 12, generating a second detection signal. The second detection signal is supplied to the analog filter 122. In accordance with the second detection signal, the controlled oscillator 101 generates a first phase signal 11 and a second phase signal 12 in order to reduce the phase difference between the reference signal 10 and the first phase signal 11. Three various configurations that the phase detector 121 may have will be described with reference to FIGS. 2A, 2B and 2C.

As FIG. 2A shows, the phase detector 121 may be configured to use the output of only one of the two ordinary phase-frequency detectors (PFDs). More specifically, the phase detector 121 of FIG. 2A comprises two D flip-flops 131 and 132 and one AND gate 133.

The D flip-flops 131 and 132 are positive-edge triggered flip-flops. Each of the D flip-flops 131 and 132 latches the value input to the D terminal on the rising edge of the clock pulse input to the clock terminal and outputs this value from the Q terminal on the rising edge of the next clock pulse. Note that any D flip-flop resets its latched value to low when the reset terminal receives a high signal. The D flip-flops 131 and 132 may alternatively be negative-edge triggered flop-flops.

The D flip-flop 131 receives the reference signal 10 at the clock terminal, and the power-supply voltage at the D terminal, and the output signal of the AND gate 133 at the reset terminal. The D flip-flop 131 outputs a signal from the Q terminal. This signal is input to one input terminal of the AND gate 133. On the other hand, the D flip-flop 132 receives the second phase signal 12 at the clock terminal, the power-supply voltage at the D terminal, and the output signal of the AND gate 133 at the reset terminal. The D flip-flop 132 outputs a signal from the Q terminal. This signal is output, as second detection signal OUT-a, to the other input terminal of the AND gate 133.

Figure 2B:
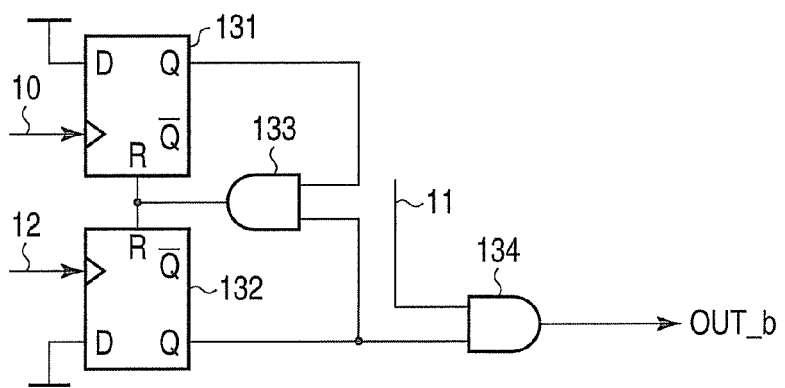
FIG. 2B is a circuit diagram showing another example of the phase detector, which differs from the phase detector shown in FIG. 2A.

As shown in FIG. 2B, the phase detector 121 may have two D flip-flops 131 and 132 and two AND gates 133 and 134. In the phase detector of FIG. 2B, the signal output from the Q terminal of the D flip-flop 132 and the first phase signal 11 are input to the AND gate 134, which generates a second detection signal OUT-b.

Figure 2C:
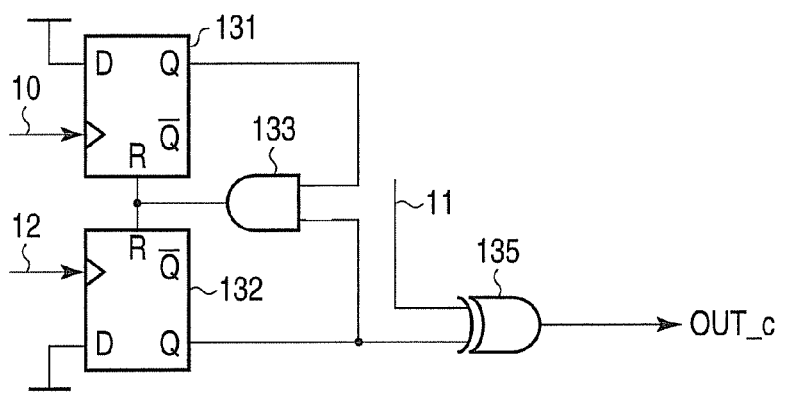
FIG. 2C is a circuit diagram showing a phase detector that differs from those shown in FIG. 2A and 2B.

As shown in FIG. 2C, the phase detector 121 may have two D flip-flops 131 and 132, an AND gate 133, and an XOR gate 135. In the phase detector of FIG. 2C, the signal output from the Q terminal of the D flip-flop 132 and the first phase signal 11 are input to the XOR gate 135, which generates a second detection signal OUT-c.

How the phase detector 121 so configured as shown in FIG. 2A, FIG. 2B or FIG. 2C operates will be explained with reference to the timing chart of FIG. 3. Assume that the frequency and phase of the first phase signal 11 are locked, at frequency division ratio of 1/4, to the frequency and phase of the reference signal 10 in the digital loop 110. Also assume that the second phase signal 12 delays in phase by 90° with respect to the first phase signal 11. (Angle of 90° corresponds to a quarter (¼) of the cycle the first and second phase signals 11 and 12 have.)

The phase detector 121 of FIG. 2A outputs a second detection signal OUT-a that corresponds to the time difference between the rising edge of the reference signal 10 and the rising edge of the second phase signal 12. That is, the output of the D flip-flop 131 goes high on the rising edge of the reference signal 10, the output of the D flip-flop 132 goes high on the rising edge of the second phase signal 12, and the output of the AND gate 132 also goes high. The D flip-flops 131 and 132 are thereby reset, and the second detection signal OUT-a goes low. Thereafter, the output of the D flip-flop 132 again goes high. Since the output of the D flip-flop 131 remains reset, the second detection signal OUT-a goes high. Then, the second detection signal OUT-a goes low again on the rising edge of the reference signal 10.

Figure 3:
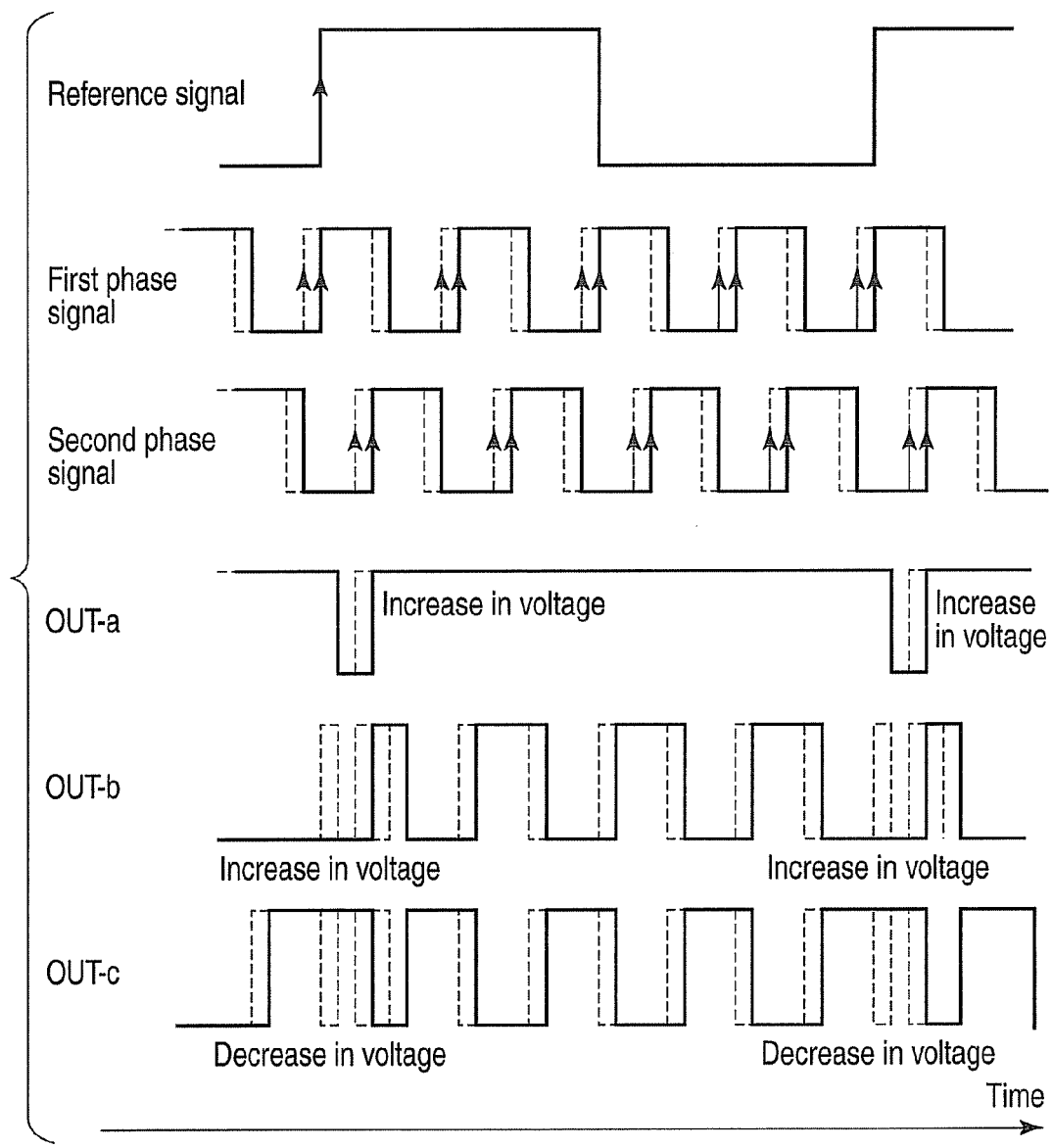
FIG. 3 is a timing chart illustrating how the circuits of FIGS. 2A, 2B and 2C operate.

Assume that the first and second phase signals 11 and 12 advance in phase as indicated by the broken lines in FIG. 3. Then, the time between the rising edge of the reference signal 10 and the rising edge of the second phase signal 12 becomes short. The second detection signal OUT-a therefore remains high for a longer time, increasing the average voltage. Thus, the phase detector of FIG. 2A can detect the phase lead as a voltage increase, and the phase delay as a voltage decrease.

The digital loop 110 locks the second phase signal 12 to the reference signal 10, imparting a constant phase difference (for example, 90°) to these signals 10 and 12. Therefore, the duty ratio of the second detection signal OUT-a will never change greatly. Even if the second phase signal 12 are unlocked, the lock detector 124, which will be described later, turns the switch 125 off, causing the analog loop 120 to stop operating for some time, and causing the digital loop 110 to lock up again. Hence, the phase detector 121 only needs to detect a small phase change in the output signal from the controlled oscillator 101 resulting from noise. The reference-signal spurious is reduced to 1/(2*frequency division ratio), as compared with the case where the second detection signal OUT-a has duty ratio of the of 50%. The reference-signal spurious can be further reduced by decreasing the phase difference between the first and second phase signals 11 and 12 to less than 90°. However, this phase difference should be preserved to some extent in order to prevent a dead zone from occurring in the phase detector 121. It is therefore desirable, not to decrease, but to set the phase difference to an appropriate value in consideration of the tradeoff of the dead zone with the reference-signal spurious.

The phase detector 121 shown in FIG. 2B outputs a second detection signal OUT-b that is the logical product of the output of the D flip-flop 132 (i.e., the second detection signal OUT-a) and the first phase signal 11. The phase detector 121 of FIG. 2B can therefore detect the phase lead as a voltage increase and the phase delay as a voltage decrease, as does the phase detector 121 shown in FIG. 2A.

As seen from FIG. 3, the duty ratio of the second detection signal OUT-b is about 50%. The average voltage is therefore suppressed to about half the power-supply voltage. This facilitates the processing of an analog signal, which will be performed later. The second detection output signal OUT-b has a larger spurious component than the aforementioned second detection signal OUT-a. Nonetheless, this result in no problems since the increased spurious component is the oscillation frequency component generated by the controlled oscillator 101.

The phase detector 121 shown in FIG. 2C outputs a second detection signal OUT-c. The second detection signal OUT-c is the exclusive OR of the output of D flip-flop 132 (i.e., the second detection signal OUT-a) and the first phase signal 11. The phase detector 121 of FIG. 2C can therefore detect the phase lead as a voltage decrease and the phase delay as a voltage increase, unlike the phase detectors 121 shown in FIGS. 2A and 2B.

As shown in FIG. 3, the duty ratio of the second detection signal OUT-c is about 50%. The average voltage is therefore suppressed to about half the power-supply voltage. This facilitates the processing of an analog signal, which will be performed later. The second detection output signal OUT-c has a larger spurious component than the aforementioned second detection signal OUT-a. Nonetheless, this result in no problems since the increased spurious component is the oscillation frequency component generated by the controlled oscillator 101.

The analog filter 122 suppresses unnecessary waves of the second detection signal output from the phase detector 121. The amplifier 123 amplifies the output signal of the analog filter 122, generating a second control signal. The control signal thus generated is input to the controlled oscillator 101. Even if the amplifier 123 is not used, the phase synchronization circuit according to this embodiment can provided. The amplifier 123 should be used, nevertheless. This is because the loop band width of the analog loop 120 can be wider if the output signal of the analog filter 122 is amplified, than if not.

The lock detector 124 can detect the phase locking and phase unlocking of the first phase signal 11. On detecting the phase locking of the first phase signal 11, the lock detector 124 turns the switch 125 on, whereby the analog loop 120 starts operating. On detecting the phase unlocking of the first phase signal 11, the lock detector 124 turns the switch 125 off, whereby the analog loop 120 stops operating.

Figure 4A:
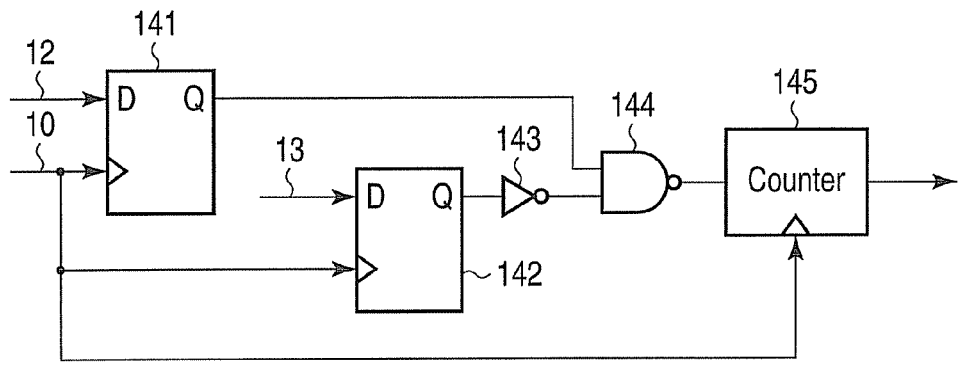
FIG. 4A is a circuit diagram showing an example of the lock detector shown in FIG. 1.
Figure 4B:
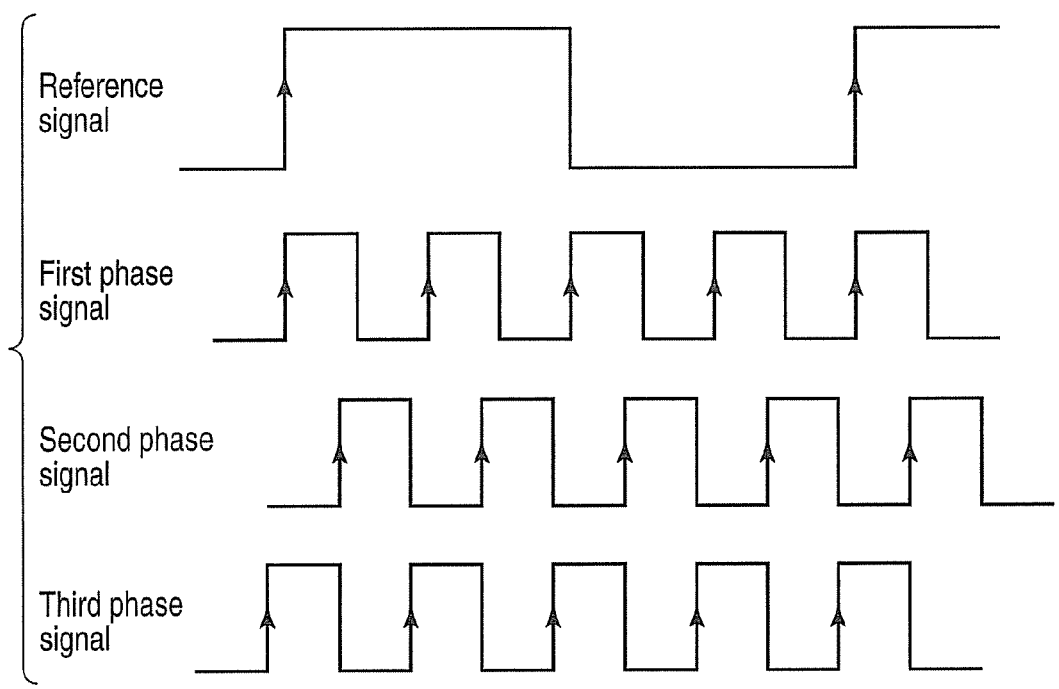
FIG. 4B is a timing chart illustrating the signals input to the circuit of FIG. 4A.

More specifically, the lock detector 124 can be such a circuit as illustrated in FIG. 4A. The circuit of FIG. 4A is disclosed in JP-A H08-79066 (KOKAI). The circuit of FIG. 4A includes two D flip-flops 141 and 142, a NOT gate 143, a NAND gate 144, and a counter 145.

The D flip-flop 141 receives the reference signal 10 at the clock terminal and the second phase signal 12 at the D terminal, and outputs an output signal from the Q terminal. The output signal of the D flip-flop 141 is input to one input terminal of the NAND gate 144. On the other hand, the D flip-flop 142 receives the reference signal 10 at the clock terminal and the third phase signal 13 at the D terminal, and outputs an output signal from the Q terminal. The third phase signal 13 leads in phase by predetermine amount with respect to the first phase signal 11. The output signal of the D flip-flop 142 is input to the NOT gate 143. The NOT gate 143 inverts the output signal of the D flip-flop 142 and inputs the same to the other input terminal of the NAND gate 144. The NAND gate 144 performs NAND operation on the output signal of the D flip-flop 141 and the output signal of the D flip-flop 142, which has been inverted the NOT gate 143. The output of the NAND gate 144 is input to the counter 145. Using the reference signal 10 as operation clock, the counter 145 counts the high and low pulses coming from the NAND gate 144. The number of high pulses counted and the number of low pulses counted are referred to as "first count value" and "second count value," respectively.

The phase of the first phase signal may be locked to the phase of the reference signal. In this case, the outputs of the D flip-flops 141 and 142 are low and high, respectively. The output of the NAND gate 144 is therefore kept high. As a result, the first count value of the counter 145 increases every time the reference signal 10 goes high. When the first count value exceeds a threshold, the counter 145 detects a phase clock, turning the switch 125 on, whereby the analog loop 120 starts operating. When the second count value exceeds a threshold, the counter 145 detects a phase unlock, turning the switch 125 off, whereby the analog loop 120 stops operating.

The lock detector 124 turns the switch 125 on or off. While the switch 125 remains on, the drive voltage is applied from the power supply to the components of the analog loop 120. The analog loop 120 therefore operates. While the switch 125 remains off, the components of the analog loop 120 are electrically disconnected from the power supply. Thus, the analog loop 120 does not operate.

The transfer of various noise and reference-signal spurious in the phase synchronization circuit of FIG. 1 will be explained below.

Figure 5A:
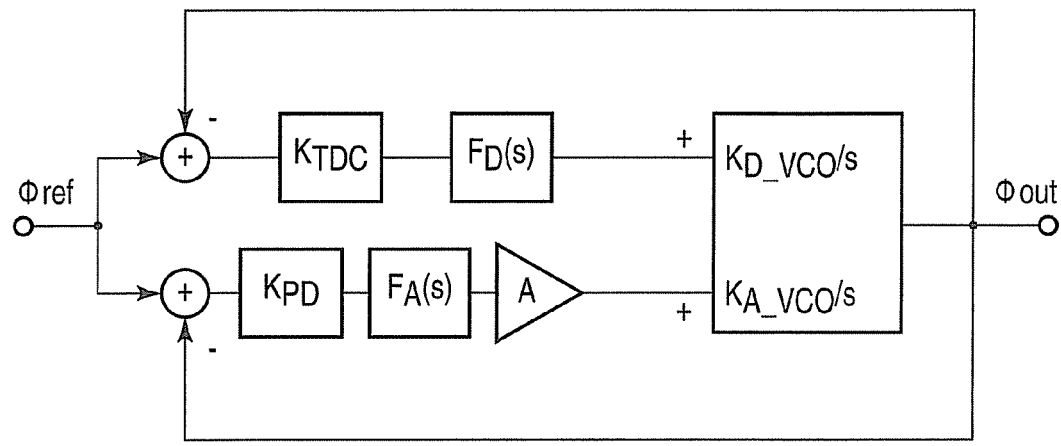
FIG. 5A is a diagram showing a linear model of the circuit shown in FIG. 1.

The phase synchronization circuit of FIG. 1 can be represented as such a linear model as shown in FIG. 5A. In FIG. 5A, $K_{TDC}$[code/rad] denotes the conversion gain of the TDC 111, $K_{PD}$[V/rad] designates the conversion gain of the phase detector 121, $F_D(s)$ denotes the transfer function of the digital filter 112, $F_A(s)$ denotes the transfer function of the analog filter 122, A designates the gain of the amplifier 123, and $K_{D\ VCO}$[Hz/code] and $K_{A\ VCO}$[Hz/V] denote, respectively, the frequency-conversion gains at the first and second control terminals of the controlled oscillator 101. Assume that phase-frequency conversion gain $K_{TDC}*K_{D\ VCO}$[Hz/rad] and the phase-frequency conversion gain $K_{PD}*K_{A\ VCO}$[Hz/rad] are equal to $K_{VCO}$[Hz/rad]. Then, the phase synchronization circuit of FIG. 1 can be represented as such a linear model as shown in FIG. 5B.

Figure 5B:
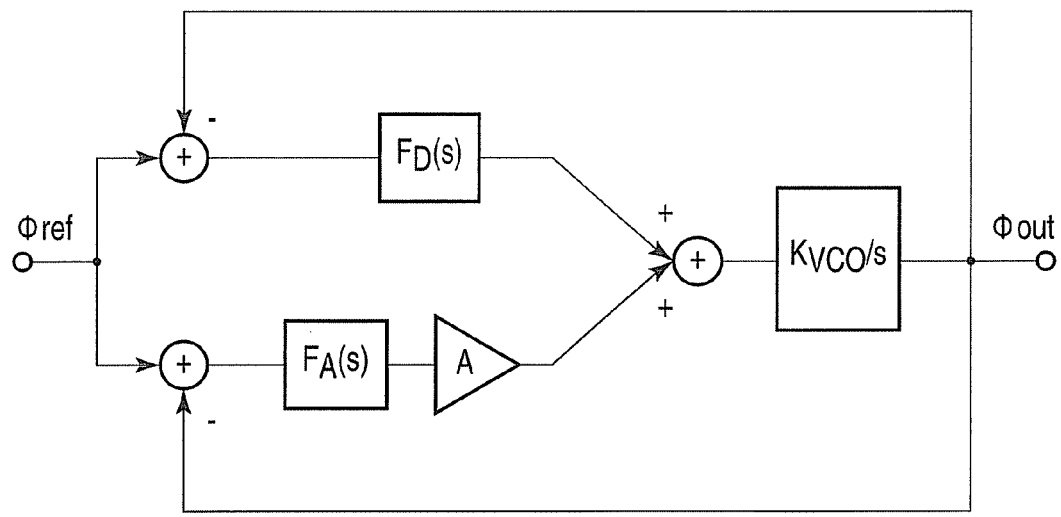
FIG. 5B is a diagram showing a simplified linear model shown in FIG. 5A.

In FIG. 5B, the frequency of the reference signal (i.e., reference frequency) is 10 MHz, and the phase-frequency conversion gain $K_{VCO}$[Hz/rad] is 400 kHz/rad. Further, the digital filter 112 is a 4th-order low-pass filter having four poles at 1 MHz, and the analog filter 122 is a 2nd-order twin T-type band rejection filter (BRF) having a notch at the reference frequency (=20 MHz). In order to suppress the reference-signal spurious, a notch is imparted to the characteristic of the analog filter 122. Thus, the notch is not absolutely necessary, because the reference-signal spurious can be sufficiently suppressed in the analog loop 120 of the phase synchronization circuit shown in FIG. 1. Nonetheless, a notch should better be imparted to the filter characteristic of the analog filter 122 since the widening of the loop band width of the analog loop 120 and the influence of the reference-signal spurious are in a trade-off relationship.

In FIG. 5B, the transfer function $H_{ol\_1}(s)$ that the digital loop 110 has while opened is expressed as follows:

$$H_{ol\_1}(s) = F_D(s) \cdot \frac{K_{VCO}}{s} = \frac{1}{\left(1 + \frac{s}{\omega_{dig}}\right)^4} \cdot \frac{K_{VCO}}{s} \tag{1}$$

where $\omega_{dig}$ is the pole frequency of the digital filter (=1 MHz).

In FIG. 5B, the transfer function $H_{ol\_2}(s)$ that the analog loop 120 has while opened is expressed as follows:

$$H_{ol\_2}(s) = F_A(s) \cdot A \cdot \frac{K_{VCO}}{s} \tag{2}$$
$$= \left(\frac{s^2 + \omega_{ana}^2}{s^2 + 4\omega_{ana}s + \omega_{ana}^2}\right) \cdot A \cdot \frac{K_{VCO}}{s}$$

where $\omega_{ana}$ is the notch frequency of the analog filter (=reference-signal frequency=20 MHz).

Figure 6A:
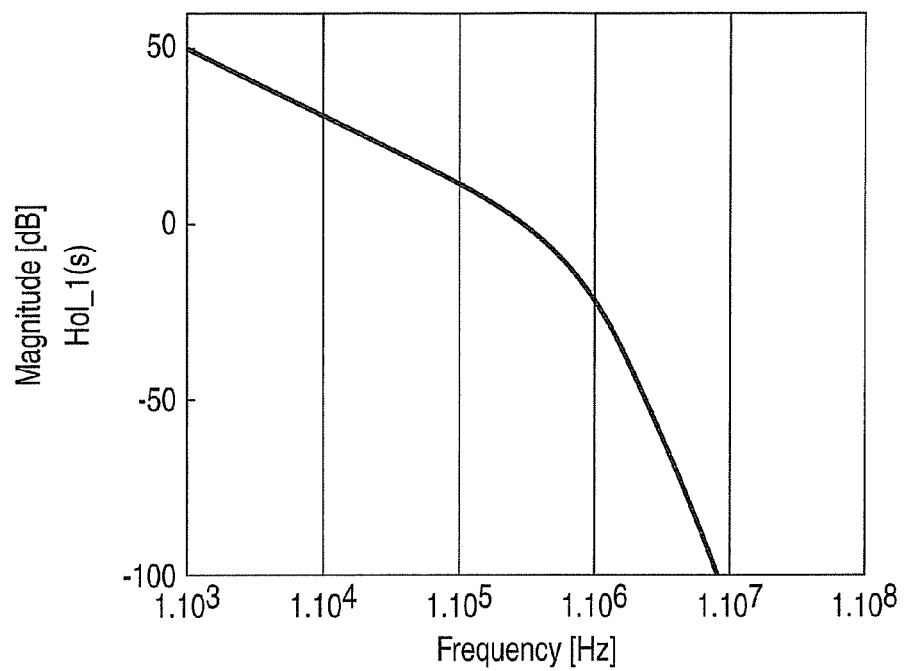
FIG. 6A is a graph representing the open-loop gain characteristic of the digital loop shown in FIG. 1.
Figure 6B:
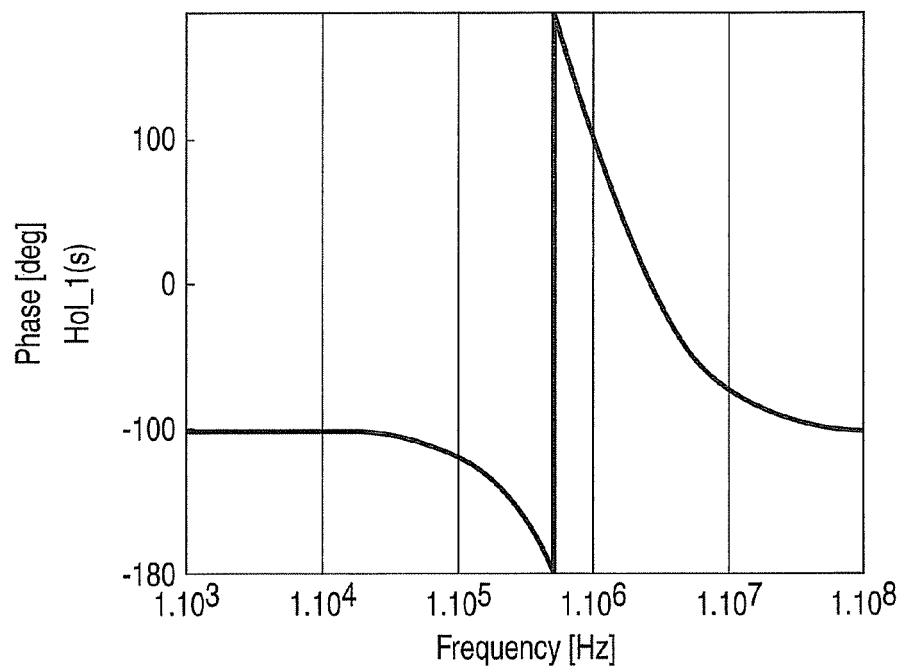
FIG. 6B is a graph representing the open-loop phase characteristic of the digital loop shown in FIG. 1.
Figure 7A:
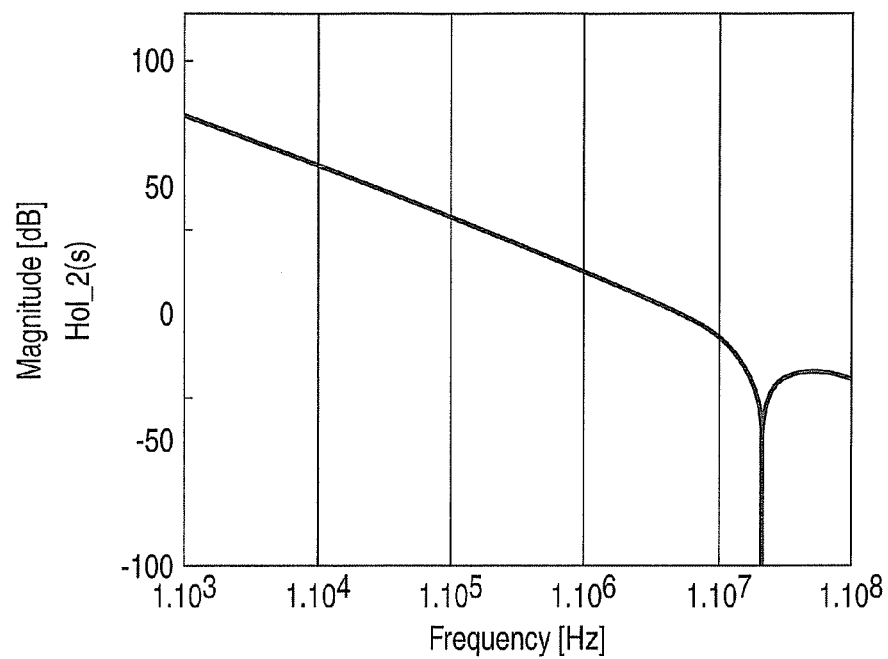
FIG. 7A is a graph representing the open-loop gain characteristic of the analog loop shown in FIG. 1.
Figure 7B:
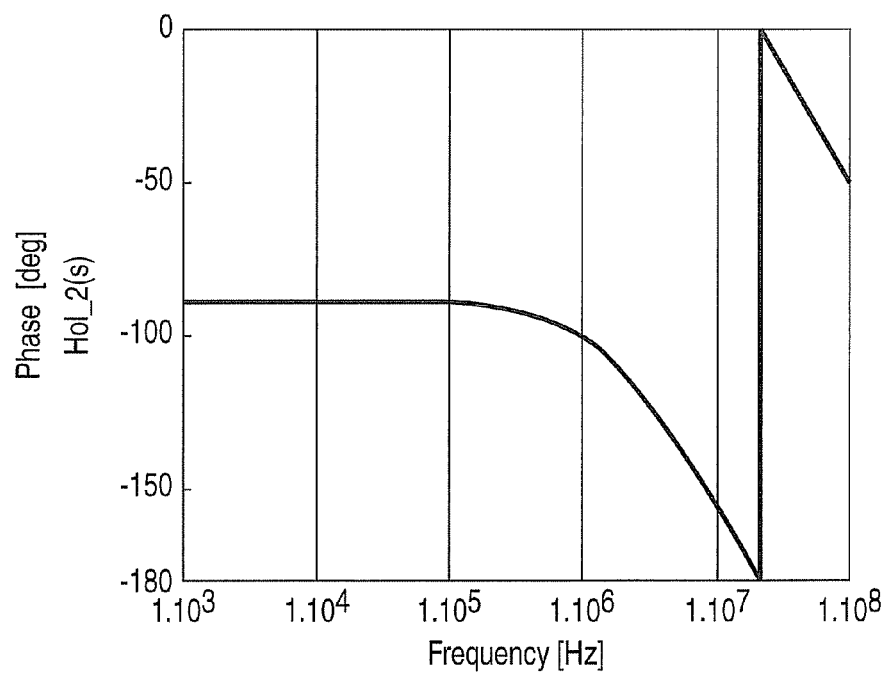
FIG. 7B is a graph representing the open-loop phase characteristic of the analog loop shown in FIG. 1.

FIG. 6A and FIG. 6B show the gain characteristic and phase characteristic of the transfer function Hol_1, respectively, and FIG. 7A and FIG. 7B show the gain characteristic and phase characteristic of the transfer function Hol_2, respectively. As FIG. 6A shows, the loop band width of the analog loop 120 is about 5 MHz (i.e., ¼ of the reference frequency) and 10 times or wider than the loop band width of the digital loop 110. As seen from FIGS. 6A and 6B and FIGS. 7A and 7B, both the digital loop 110 and the analog loop 120 have a phase margin of about 50°.

A transfer model of the phase noise Φn generated in the controlled oscillator 101 is shown in FIG. 8. In FIG. 8, Φout is the first phase signal 11. The following equation derives from FIG. 8:

$$\phi_n - \frac{K_{VCO}}{s}\{\phi_{out} \cdot F_D(s) + \phi_{out} \cdot A \cdot F_A(s)\} = \phi_{out} \tag{3}$$

From the equation (3), the transfer function of phase noise generated in the controlled oscillator 101 is expressed as follows:

$$H_{cl\_vco}(s) = \frac{\phi_{out}}{\phi_n} = \frac{s}{s + K_{VCO}(F_D(s) + A \cdot F_A(s))} \tag{4}$$

As shown in the equation (4) and FIG. 9, the transfer function Hcl_vco of the phase noise Φn generated in the controlled oscillator 101 is equivalent to a 1st-order high-pass filter (HPF). The cut-off frequency of this HPF depends on the transfer function $F_A(s)$ of the analog filter 122 and the gain A of the amplifier 123, rather than the transfer function $F_D(s)$ of the digital filter 112. Hence, the phase noise Φn generated in the controlled oscillator 101 can be suppressed over a wide band by widening the loop band width of the analog loop 120, not by constituting the PLL by the digital loop 110 only.

A transfer model of the quantization noise Vtdc generated in the digital loop 110 is shown in FIG. 10. In FIG. 10, transfer function Hcl_1(s) is expressed as follows:

$$H_{cl\_1}(s) = \frac{\phi_{out}}{V_{in1}} = \frac{K_{VCO}}{s + K_{VCO} \cdot F_D(s)} \quad (5)$$

A transfer model of the reference-signal spurious Vsp generated in the analog loop 120 is shown in FIG. 11. In FIG. 11, transfer function Hcl_2 (s) is expressed as follows:

$$H_{cl\_2}(s) = \frac{\phi_{out}}{V_{in2}} = \frac{K_{VCO} \cdot A}{s + K_{VCO} \cdot F_A(s) \cdot A} \quad (6)$$

The transfer function Htdc(s) of the quantization noise Vtdc derives as follows, from the equations (5) and FIG. 10:

$$H_{tdc}(s) = \frac{\phi_{out}}{V_{tdc}} = \frac{F_D(s) \cdot H_{cl\_1}(s)}{1 + F_D(s) \cdot H_{cl\_1}(s)} \quad (7)$$

The transfer function Hsp(s) of the reference-signal spurious Vsp is expressed as follows, in view of the equation (6) and FIG. 11:

$$H_{sp}(s) = \frac{\phi_{out}}{V_{sp}} = \frac{A \cdot F_A(s) \cdot H_{cl\_2}(s)}{1 + A \cdot F_A(s) \cdot H_{cl\_2}(s)} \quad (8)$$

Figure 12:
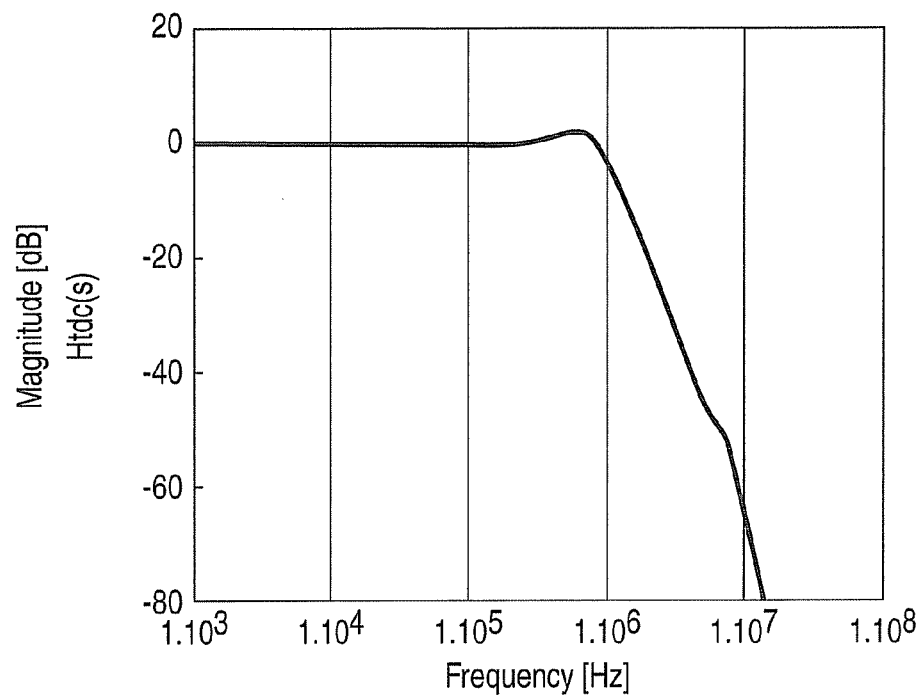
FIG. 12 is a graph representing the gain characteristic of transfer function of the quantization noise generated in the digital loop shown in FIG. 1.
Figure 13:
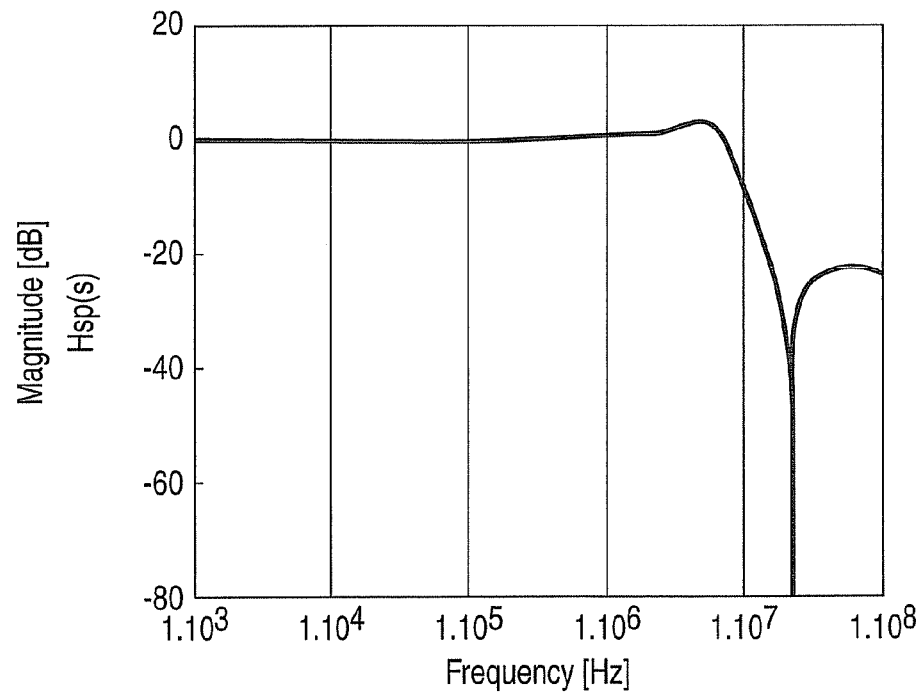
FIG. 13 is a graph representing the gain characteristic of transfer function of the reference-signal spurious generated in the analog loop shown in FIG. 1.

FIG. 12 shows the gain characteristic of the transfer function Htdc(s), and FIG. 13 shows the gain characteristic of the transfer function Hsp(s). As shown in the equations (5) and (7) and FIG. 12, the transfer function Htdc of the quantization noise Vtdc is equivalent to a 1st-order LPF. The cut-off frequency of the LPF depends on the transfer function FD(s) of the digital loop 110. The quantization noise Vtdc can therefore be suppressed over a wide band, by narrowing the loop band width of the digital loop 110. As FIG. 13 shows, the analog filter 122 limits the reference-signal spurious Vsp in terms of band. Therefore, the combination of the digital loop 110 and analog loop 120, which have a narrow loop band width and a wide loop band width, respectively, can suppress, over a wide band, the quantization noise Vtdc and the phase noise Φn generated in the controlled oscillator 101.

Since the analog loop 120 limits the reference-signal spurious in terms of band, the loop band width of the analog loop 120 should be set to an appropriate value, trading off with the spurious to limit in band. To this end, it is desirable to use a notch filter as analog filter 112 if the phase noise Φn, for example, must be suppressed over a wide band.

As described above, the phase synchronization circuit according to this embodiment comprises a narrowband digital loop for locking the frequency and the phase and a wideband analog loop for removing the phase noise generating in the controlled oscillator. The phase synchronization circuit can therefore suppress, over a wide band, both the quantization noise and the phase noise generated in the controlled oscillator. Further, the analog filter can be designed to have a small area, because the cut-off frequency of the analog filter included in the analog loop can be set higher than hitherto possible (for example, to ¼ of the reference frequency or a higher frequency). The area that the analog loop occupies can ultimately be reduced. Moreover, the phase synchronization circuit according to this embodiment need not have frequency dividers because the digital loop locks the frequency and the phase. The phase synchronization circuit therefore occupies a smaller area and consume less power, than the conventional circuit.

Second Embodiment

As seen from FIG. 14, a phase synchronization circuit according to a second embodiment of this invention differs from the circuit of FIG. 1, in that a VCO 201 and a digital loop 210 replace the controlled oscillator 101 and the digital loop 110, respectively. In FIG. 14, the components identical to those shown in FIG. 1 are designated by the same reference numbers. The components characterizing the second embodiment will be described in the main.

In the digital loop 210 that corresponds to the digital loop 110 shown in FIG. 1, a digital-to-analog converter (DAC) 213 is connected to the output of the digital filter 112. The DAC 213 receives a digital output signal from the digital filter 112 and converts the same to an analog signal. The analog signal is input, as the first signal, to the VCO 201.

The VCO 201 is constituted by a ring oscillator comprising a plurality of inverting amplifiers that are circularly connected in cascade. The VCO 201 receives the first control signal from the DAC 213, at the first control terminal, and the second control signal from amplifier 123, at the second control terminal. The VCO 201 generates multi-phase signals having a common oscillation frequency that accords with the voltages of the first and second control signals. The multi-phase signals have as many phases as the inverting amplifiers. The second embodiment will be described on the assumption that the VCO 201 comprises four inverting amplifiers, that the first phase signal 11 is input to the TDC 111 and that the second phase signal 12 different in phase by 90° from the first phase signal is input to the phase detector 121. The phase difference between the first and second phase signals 11 and 12 need not be 90°, and may appropriately be determined to trade off the dead zone of the phase detector 121 with the reference-signal spurious. The DAC 213 and the VCO 201 may be replaced by a digitally controlled oscillator (DCO).

As explained above, the phase synchronization circuit according to this embodiment has a ring oscillator, not a controlled oscillator as in the first embodiment. Therefore, the phase synchronization circuit can generate the multi-phase signals without using a phase shifter, and supply the multi-phase signals to the digital loop and the analog loop.

Third Embodiment

As seen from FIG. 15, a phase synchronization circuit according to a third embodiment of this invention differs from the circuit of FIG. 1, in that a controlled oscillator 301, a differential to single-phase converter 302 and a phase shifter 303 replace the controlled oscillator 101. In FIG. 15, the components identical to those shown in FIG. 1 are designated by the same reference numbers. The components characterizing the third embodiment will be described in the main.

The controlled oscillator 301 is an LC oscillator that includes variable capacitors and generates less noise than the VCO 201 described above. In the controlled oscillator 301, the first control signal input from the digital filter 112 to the first control terminal discretely controls the variable capacitors in terms of capacitance. The second control signal input from the amplifier 123 to the second control terminal also controls capacitances of the variable capacitors. Thus, the controlled oscillator 301 outputs, to the differential to single-phase converter 302, differential oscillation signals having a common oscillation frequency that accords with a combination of the first and second control signals. Unlike the controlled oscillator 101 and the VCO 201, the controlled oscillator 301 cannot generate multi-phase signals.

The differential to single-phase converter 302 receives differential oscillation signals from the controlled oscillator 301 and converts these signals to a single-phase oscillation signal. The singe-phase oscillation signal is input as first phase signal 11 to the TDC 111 and phase shifter 303.

The phase shifter 303 shifts the phase of the first phase signal 11 by a prescribed value (for example, 90°), generating a second phase signal 12. The second phase signal 12 is input to the phase detector 121 and lock detector 124. The value by which the phase shifter 303 should phase-shift the first phase signal 11 may so appropriately determined to trade off the dead zone of the phase detector 121 with the reference-signal spurious, as pointed out above.

As specified above, the phase synchronization circuit according to this embodiment has an LC oscillator, not a controlled oscillator as in the first embodiment. The phase noise can therefore be reduced much more than is possible in the phase synchronization circuit according to the first embodiment.

Fourth Embodiment

As shown in FIG. 16, a phase synchronization circuit according to a fourth embodiment of this invention differs from the circuit of FIG. 1, in that a controlled oscillator 401 replaces the controlled oscillator 101. In FIG. 16, the components identical to those shown in FIG. 1 are designated by the same reference numbers. The components characterizing the fourth embodiment will be described in the main.

The controlled oscillator 401 comprises an orthogonal oscillator and first and second operational amplifiers. The orthogonal oscillator comprises first and second LC oscillators connected, forming a ring. The first and second LC oscillators include variable capacitors each. The first and second operational amplifiers perform differential to single-phase conversion on the outputs of the first and second LC oscillators, respectively. The controlled oscillator 401 generates, but less noise than the VCO 201 described above. In the controlled oscillator 401, the first control signal input from the digital filter 112 to the first control terminal discretely controls the variable capacitors in terms of capacitance. The second control signal input from the amplifier 123 to the second control terminal also controls the capacitances of the variable capacitors. Thus, in the controlled oscillator 401, the first LC oscillator generates the first differential oscillation signals having a common oscillation frequency that accords with the first control signal and the voltage of second control signals, and the second LC oscillator generates the second differential oscillation signals differs in phase by 90° from the first differential oscillation signal. The first operational amplifier converts the first differential signals to a single-phase signal, which is output as first phase signal 11 to the TDC 111. The second operational amplifier converts the second differential signals to a single-phase signal, which is output as second phase signal 12 to the phase detector 121.

As specified above, the phase synchronization circuit according to this embodiment has an orthogonal oscillator comprising LC oscillators, not a controlled oscillator as in the first embodiment. The phase noise can therefore be reduced much more than is possible in the phase synchronization circuit according to the first embodiment. In addition, the phase synchronization circuit need not incorporate phase shifters, unlike the phase synchronization circuit according to the third embodiment.

Fifth Embodiment

Figure 17:
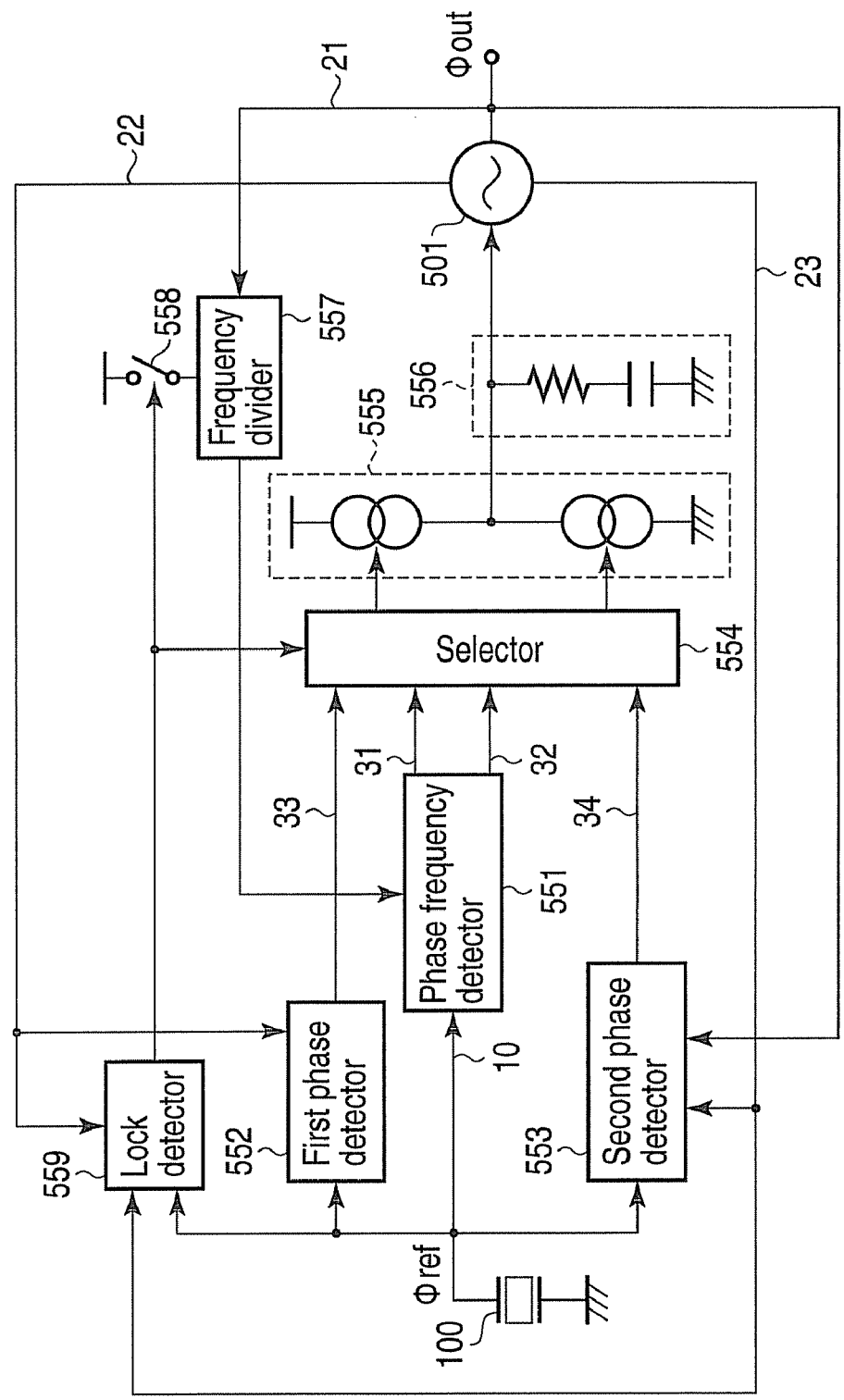
FIG. 17 is a block diagram showing a phase synchronization circuit according to a fifth embodiment.

As shown in FIG. 17, a phase synchronization circuit according to a fifth embodiment has a reference signal generator 100, a VCO 501, a phase frequency detector 551, a first phase detector 552, a second phase detector 553, a selector 554, a charge pump 555, a loop filter 556, a frequency divider 557, a switch 558, and a lock detector 559. The reference signal generator 100 is identical in configuration to the reference signal generator incorporated in the phase synchronization circuits according to the first to fourth embodiments, and will not be described below.

The VCO 501 outputs an oscillation signal having a frequency that accords with the voltage of a control signal input to the control terminal of the VCO 501 from the loop filter 556, which will be described later. The VCO 501 can output at least three oscillation signals (phase signals) that differ in phase from one another. The following description is based on the assumption that the VCO 501 outputs a first phase signal 21, a second phase signal 22, and a third phase signal 23. The second phase signal 22 is delayed by a prescribed value with respect to the phase Φout of first phase signal 21. The third phase signal 23 is advanced by a prescribed value with respect to the phase Φout. The first phase signal 21 is input to the second phase detector 553 and frequency divider 557. The second phase signal 22 is input to the lock detector 559 and first phase detector 552. The third phase signal 23 is input to the lock detector 559 and second phase detector 553.

The phase frequency detector 551 is a phase frequency detector of the type for use in ordinary PLLs and configured to detect the frequency difference and phase difference between the reference signal 10 and the frequency-divided signal output from the frequency divider 557. (The frequency divider 557 will be described later.) In accordance with the frequency difference and phase difference detected, the phase frequency detector 551 input first up-signal 31 and first down-signal 32 to the selector 554.

The selector 554 selects the first up-signal 31 or the first down-signal 32 and second-up signal 33 (later described) or second down-signal (later described), and input the two signals selected to the charge pump 555. More precisely, the selector 554 selects the second up-signal 33 and second down-signal 34 if the lock detector 559 has detected a phase lock (later described), and selects the first down-signal 31 and first down-signal 32 if the lock detector 559 has not detected a phase lock.

The charge pump 555 is, for example, a booster circuit shown in FIG. 17. As shown in FIG. 17, the charge pump 555 comprises a first current source provided between the power supply and the output terminal, and a second current source provided between the output terminal and the ground. The first current source outputs an up-current in accordance with the pulse width of the first up-signal 31 or second up-signal 33 the selector 554 has selected. The second current source outputs a down-current in accordance with the pulse width of the first down-signal 32 or second down-signal 34 the selector 554 has selected. The charge pump 555 inputs to the loop filter 556 an output current that accords with the difference between the up-current and the down-current.

The loop filter 556 is a low-pass filter that comprises, for example, a resistor and a capacitor (i.e., RC). The loop filter 556 suppresses high-frequency components output from the current the charge pump 555, smoothing the output current and generating a control signal. The control signal is input to the VCO 501. Controlled by the control signal, the VCO 501 generates a first phase signal 21, a second phase signal 22, and a third phase signal 23, so that the frequency difference and phase difference between the reference signal 10 and the first phase signal 21 may decrease.

The frequency divider 557 divides the frequency of the first phase signal 21 by, for example, an integral frequency-division ratio, generating a frequency-divided signal. The frequency-divided signal is input to the phase frequency detector 551. The frequency-division ratio is determined from the ratio of the oscillation frequency of the first phase signal 21 to the frequency of the reference signal 10.

The electrical connection of the frequency divider 557 to the power supply for applying a drive voltage can be switched by the switch 558, which will be described later. More specifically, when the lock detector 559 detects the phase lock, the switch 558 electrically disconnects the frequency divider 557 from the power supply, turning off the frequency divider 557. When the lock detector 559 detects the release of phase lock, the switch 558 electrically connects the frequency divider 557 to the power supply, turning the frequency divider 557 on. Thus, the first phase detector 552 and the second phase detector 553 do not detect the frequency difference between the two input signals. In other words, the two input signals need not have the same frequency. Therefore, the switch 558 keeps turning the frequency divider 557 off, reducing the power consumption of the entire circuit, as long as the phase lock is being detected.

The lock detector 559 is identical in configuration to the lock detector 124. That is, the lock detector 124 has the configuration shown in FIG. 4A. The lock detector 124 detects the phase lock or the release thereof and inputs a signal representing the result of the detection to the selector 554 and switch 558.

The technical significance of using the first phase detector 552 and second phase detector 553 will be described. The following description is based on the assumption that the frequency divider 557 has a frequency-division ratio of 4.

As pointed out above, the phase frequency detector 551 is a phase frequency detector of the type for use in ordinary PLLs. The dead zone of the phase frequency detector 551 will inevitably degrade the phase-noise characteristic of the entire PLL if the signal obtained by frequency-dividing the first phase signal 21 is locked, or has the same frequency and phase as the reference signal 10. Therefore, on detecting a phase lock, the lock detector 559 causes the switch 558 to turn off the frequency divider 557 and causes the selector 554 to select the second up-signal 33 and second down-signal 34, not the first up-signal 31 and first down-signal 32. Thus, as long as the phase synchronization circuit of FIG. 17 remains in phase-locked state, not the phase frequency detector 551, but the first phase detector 552 and second phase detector 553 operate, preserving the phase lock.

Figure 18A:
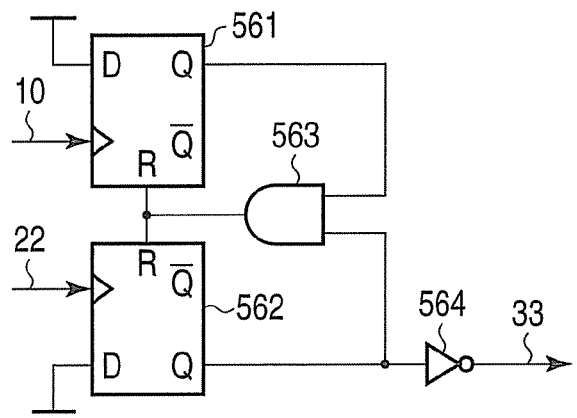
FIG. 18A is a circuit diagram showing an example of the first phase detector shown in FIG. 17.

The first phase detector 552 may comprise, as shown in FIG. 18A, two D flip-flops 561 and 562, an AND gate 563, and a NOT gate 564.

The D flip-flops 561 and 562 are positive-edge triggered flip-flops. Each of the D flip-flops 561 and 562 latches the value input to the D terminal on the rising edge of the clock pulse input to the clock terminal, and outputs this value from the Q terminal on the rising edge of the next clock pulse. Each D flip-flop resets its latched value to low when a high signal is input to the reset terminal. Note that D flip-flops 561 and 562 may be negative-edge triggered flip-flops.

The D flip-flop 561 receives the reference signal 10 at the clock terminal, the power-supply voltage at the D terminal and the output signal of the AND gate 563 at the reset terminal, and outputs a signal from the Q terminal to one input terminal of the AND gate 563. The D flip-flop 562 receives the second phase signal 22 at the clock terminal, the power-supply voltage at the D terminal, and the output signal of the AND gate 563 at the reset terminal, and outputs a signal from the Q terminal to the NOT gate 564 and to the other input terminal of the AND gate 563. The NOT gate 564 inverts the input signal, generating a second up-signal 33.

Figure 18B:
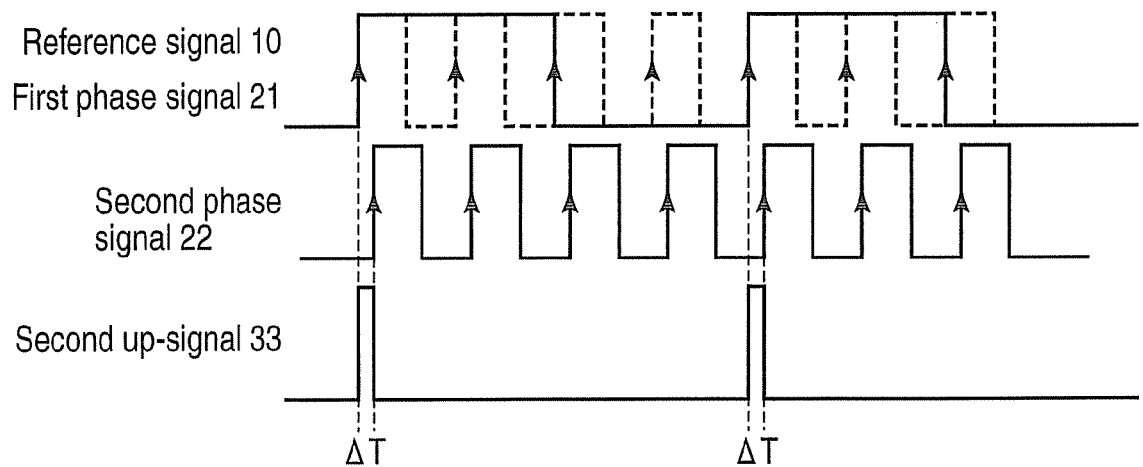
FIG. 18B is a timing chart illustrating how the circuit of FIG. 18A operates.

The first phase detector 552 detects the second up-signal 33 having pulse width T that represents the phase difference between the reference signal 10 and the second phase signal 22 that is delayed, as shown in FIG. 18B, in phase by a predetermined value ($\Delta T$) with respect to the first phase signal 21.

Figure 19A:
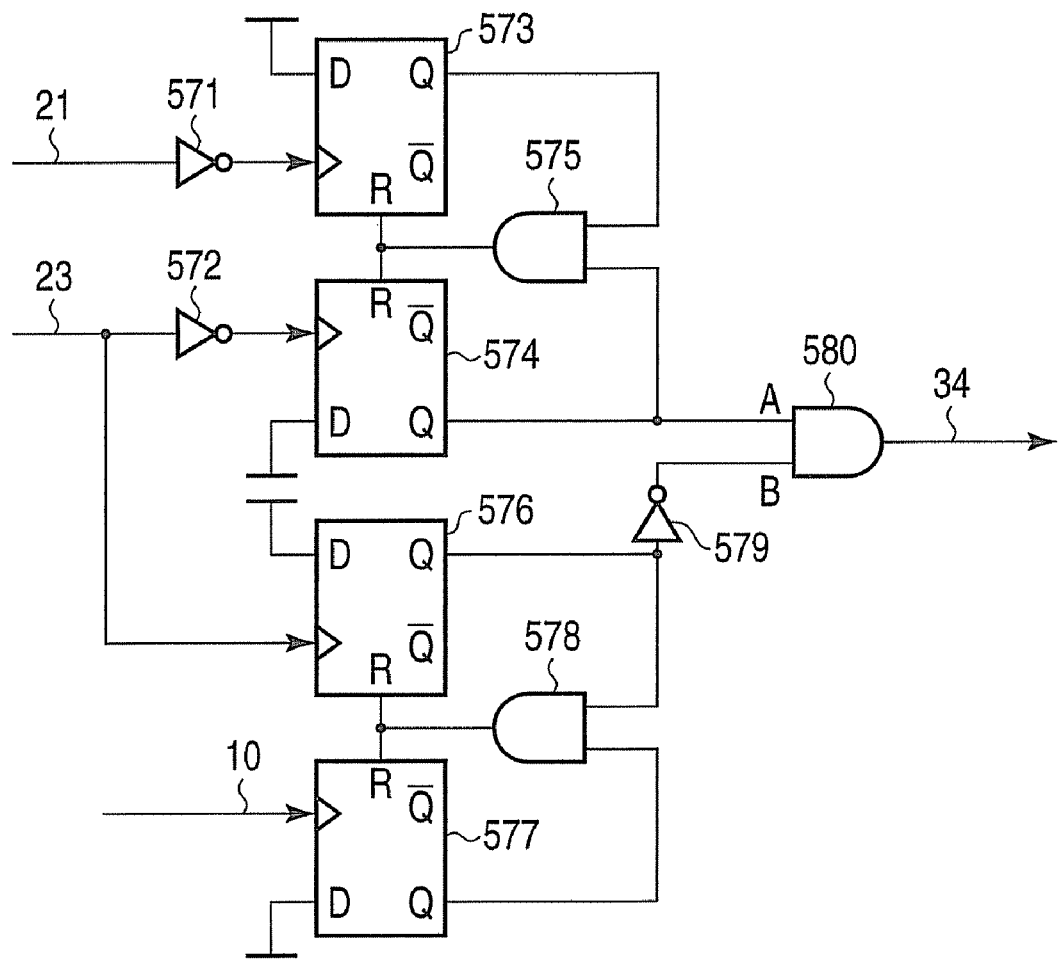
FIG. 19A is a circuit diagram showing an example of the second phase detector shown in FIG. 17.

As shown in, for example, FIG. 19A, the second phase detector 553 comprises, for example, four D flip-flops 573, 574, 576 and 577, three AND gates 575, 578 and 580, and three NOT gates 571, 572 and 579.

The D flip-flops 573, 574, 576 and 577 are positive-edge triggered flip-flops. Each of the D flip-flops latches the value input to the D terminal on the rising edge of the clock pulse input to the clock terminal, and outputs a signal from the Q terminal on the rising edge of the next clock pulse. Each D flip-flop resets the value to low when a high signal is input to the reset terminal. Note that the D flip-flops 573, 574, 576 and 577 may be negative-edge triggered flip-flops.

The NOT gate 571 inverts the first phase signal 21 and inputs the same to the clock terminal of the D flip-flop 573. The D flip-flop 573 receives the power-supply voltage at the D terminal and the output signal of the AND gate 575 at the reset terminal. The output signal of the D flip-flop 573, which is outputs from the Q terminal, is input to the AND gate 575.

The NOT gate 575 inverts the third phase signal 23 and inputs the same to the clock terminal of the D flip-flop 574. The D flip-flop 574 receives the power-supply voltage at the D terminal and the output signal of the AND gate 575 at the reset terminal. The output signal of the D flip-flop 574, which is outputs from the Q terminal, is input to the AND gate 575 and the AND gate 580.

The NOT gate 576 receives the third phase signal, the power-supply voltage at the D terminal, and the output signal of the AND gate 578 at the reset terminal. The output signal of the D flip-flop 576, which has been supplied from the Q terminal, is input to the NOT gate 579 and the AND gate 578. The NOT gate 579 inverts the signal input from the D flip-flop 576 and inputs the same to the AND gate 580.

The D flip-flop 577 receives the reference signal 10 at the clock terminal and the power-supply voltage at the D terminal, and the output signal of the AND gate 578 at the reset terminal. The output signal of the D flip-flop 577, which is output from the Q terminal, is input to the AND gate 578.

The AND gate 580 receives a signal from the D flip-flop 574 (hereinafter referred to as "signal A"), and a signal from the NOT gate 579 (hereinafter referred to as "signal B"). The AND gate 580 generates the logical product of the signals A and B. The logical product is output as second down-signal 34.

Figure 19B:
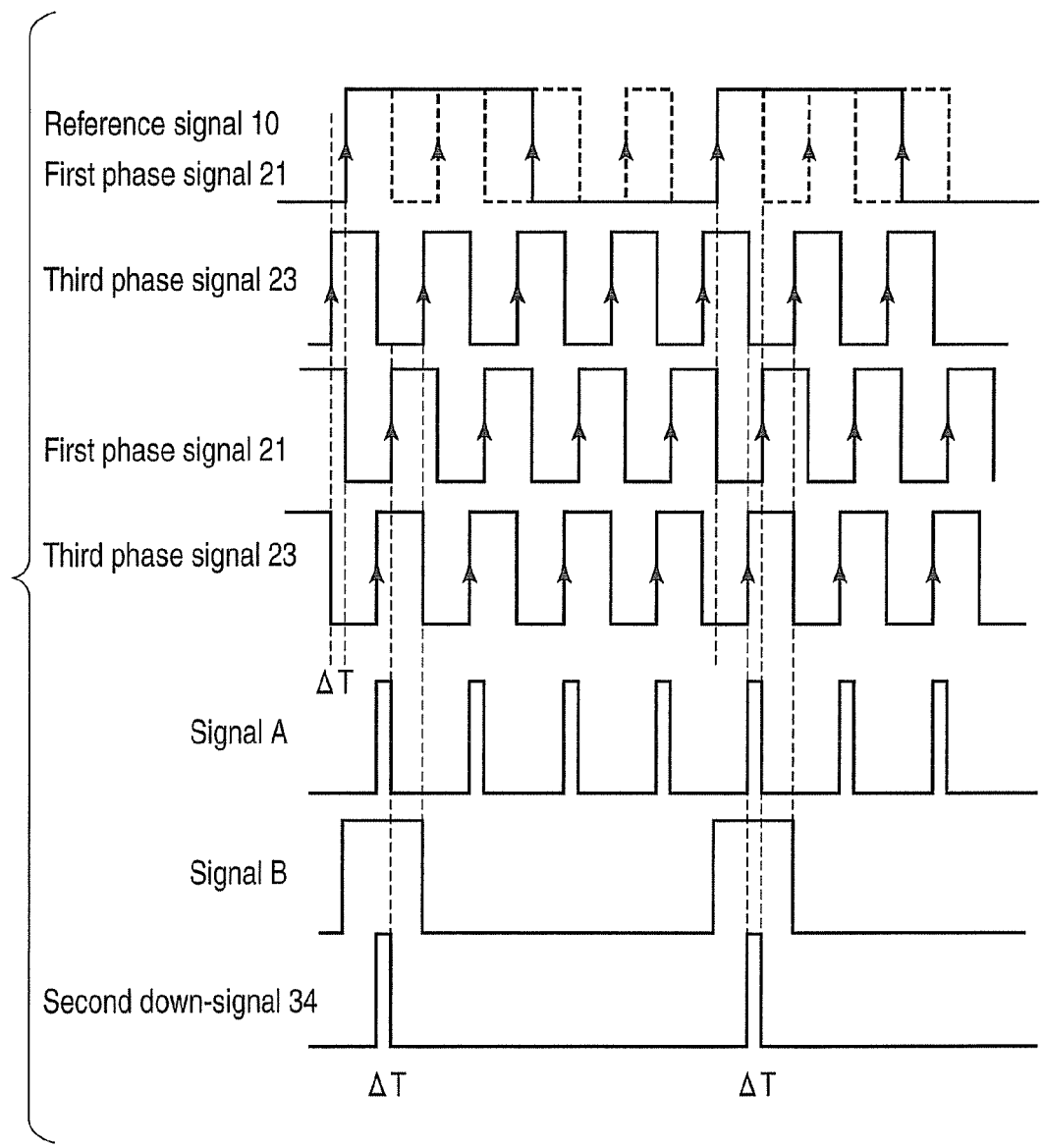
FIG. 19B is a timing chart illustrating how the circuit of FIG. 19A operates.

As FIG. 19B shows, signal A is a signal having pulse width $\Delta T$ and represents phase difference between the inverted signal of the third phase signal 23 advanced by a predetermined value ($\Delta T$) with respect to the first phase signal 21 and the inverted signal of the first phase signal 21. The cycle of signal A is equal to that of the first phase signal 21. (That is, the cycle is a quarter (¼) of the cycle the reference signal 10.) By contrast, the signal B is a signal representing the phase difference between the third phase signal 23 and the reference signal 10. The cycle of signal B is equal to that of the reference signal 10. The second down-signal 34, which is a logical product of signals A and B, therefore has a pulse width ΔT and a cycle equal to that of the reference signal 10.

Thus, both the second up-signal 33 and the second down-signal have pulse width ΔT. The up-current and down-current of the charge pump 555 are therefore equal to each other, thereby preserving the phase lock.

Figure 20:
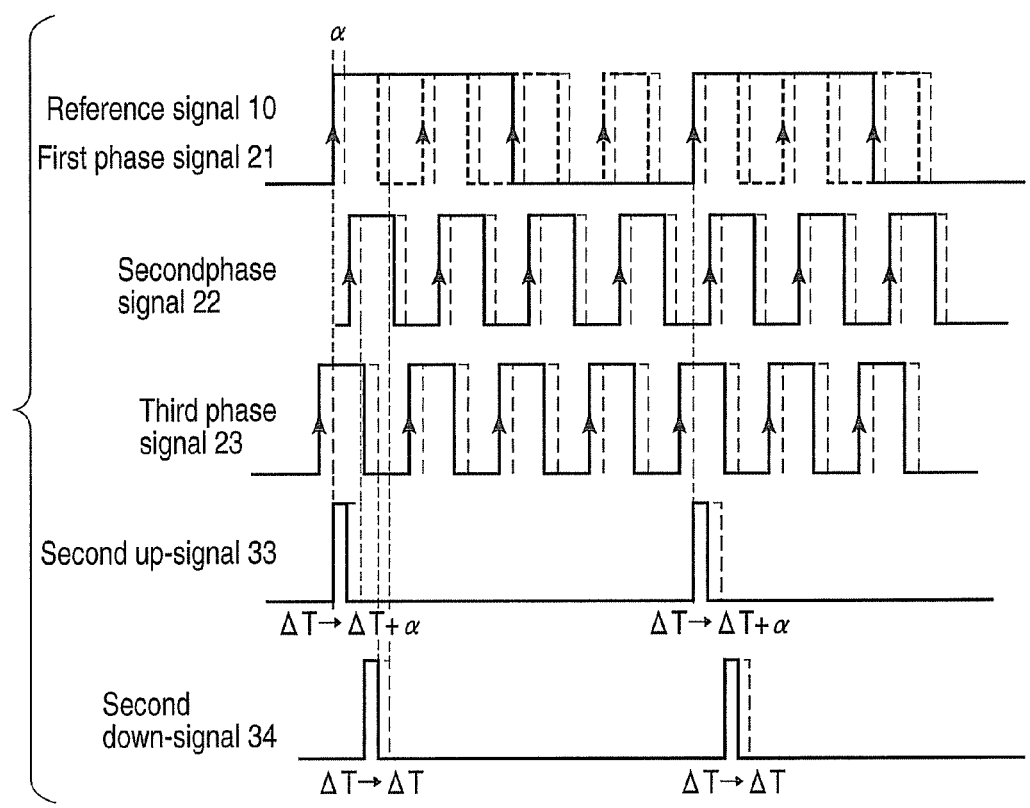
FIG. 20 is a timing chart illustrating how the circuits of FIG. 18A and 19A operate to compensate for the delay of the first, second and third phase signals.

How the phase lock is preserved by virtue of the second up-signal 33 and the second down-signal 34 will be explained in further detail. Assume that the output signals of the VCO 501 are delayed in phase by α as shown in FIG. 20, due to the disturbance such as a temperature change or a noise. Then, the pulse width of the second up-signal 33 is equivalent to the phase difference between the reference signal 10 and the second phase signal 22. That is, the second up-signal 33 has pulse width of ΔT+α. Nonetheless, the pulse width of the second down-signal 34 remains ΔT because it is equivalent to the phase difference between the first phase signal 21 and the third phase signal 23. Note that the rising edge of the second down-signal 34 is delayed by α, because it is determined by the falling edge of the third phase signal 23.

Hence, the up-current flows in the charge pump 555 in a greater amount than the down-current, by a value equivalent to the change (α) in the pulse width of the second up-signal 33. The output signals of the VCO 501 are therefore advanced in phase. Thereafter, the phase difference between the reference signal 10 and the first phase signal 21 gradually decreases due to negative feedback. The phase lock is thereby preserved. Even if the phase of output signals of the VCO 501 are advanced by α, the second up-signal 33 will have a pulse width of ΔT−α. In this case, too, the phase lock is preserved.

It is desired that the value (ΔT) by which the second phase signal 22 and the third phase signal 23 delay and advance, respectively, with respect to the first phase signal 21 should be greater than the dead zone of the first and second phase detectors 552 and 553.

As described above, the phase synchronization circuit according to this embodiment uses an ordinary PLL until the phase lock is achieved. Once the phase lock has been achieved, however, the circuit uses a phase detector, preserving the phase lock in order to avoid the dead zone of each phase frequency comparator. Therefore, the phase synchronization circuit can prevent the phase-noise characteristic of the PLL from degrading, by using only the delay elements absolutely necessary. The circuit can therefore have a smaller circuit area than the conventional phase synchronization circuit. Moreover, in the phase synchronization circuit according to this embodiment, the frequency divider is turned off the moment the phase lock is achieved. The phase synchronization circuit therefore consumes less power than conventional phase synchronization circuit.

Sixth Embodiment

As shown in FIG. 21, a phase synchronization circuit according to a sixth embodiment of this invention differs from the circuit of FIG. 17 in that a selector 654 replaces the selector 554 and a control-clock generation circuit 660 is provided between the lock detector 559 and the selector 654. In FIG. 21, the components identical to those shown in FIG. 17 are designated by the same reference numbers. The components characterizing the sixth embodiment will be described in the main.

The control-clock generation circuit 660 converts the output signal of the lock detector 559 to two control clock signals D1 and D2 that do not overlap in terms of pulse duration. The control clock signals D1 and D2 are input to the selector 654. The selector 654 selects an up-signal and a down-signal in accordance with the control clock signals D1 and D2.

An example of the control-clock generation circuit 660 will be described with reference to FIG. 22A and FIG. 22B.

Figures 22A, 22B:
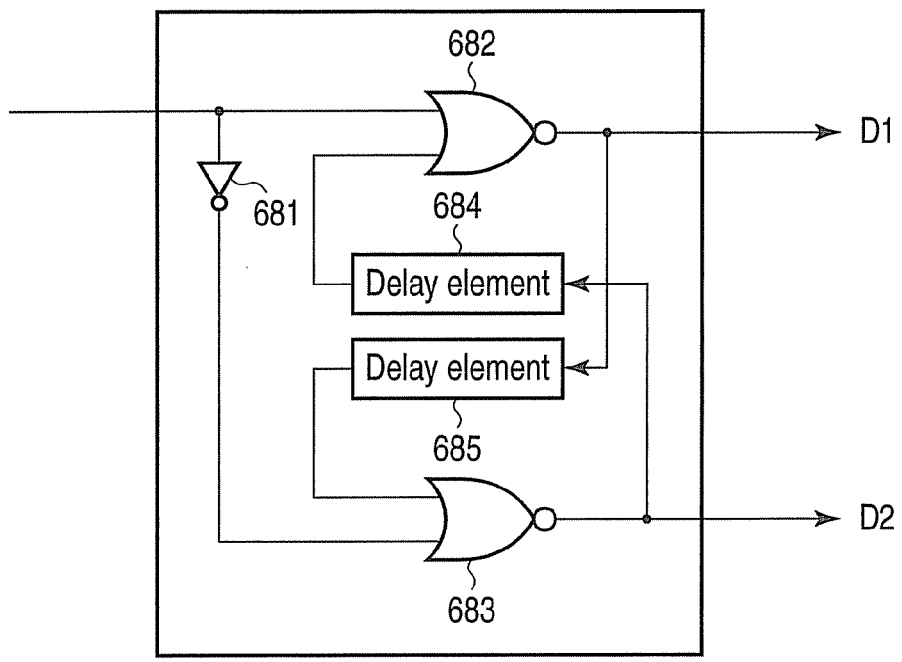
FIG. 22A is a circuit diagram showing an example of the control clock generating circuit shown in FIG. 21.
FIG. 22B is a timing chart illustrating how the circuit of FIG. 22A operates.

As FIG. 22A shows, the control-clock generation circuit 660 includes a NOT gate 681, NOR gates 682 and 683, and delay elements 684 and 685. The output signal of the lock detector 559 is input to the NOT gate 681 and the NOR gate 682. The NOT gate 681 inverts the output signal of the lock detector 559 and input the same to the NOR gate 683.

The output signal of the NOR gate 682 is input, as control clock D1, to the selector 654 and the delay element 685. The output signal of the NOR gate 683 is input, as control clock D2, to the selector 654 and the delay element 684.

The delay element 684 delays the control clock D2 by a predetermined time and outputs the same to the NOR gate 682. The delay element 685 delays the control clock D1 by a predetermined time and outputs the same to the NOR gate 683.

As shown in FIG. 22B, on the rising edge of the output of the lock detector (that is, at the time of detecting the phase lock), the output signal of the NOR gate 682, i.e., control clock D1, goes low. Since the control clock D1 is input to the NOR gate 638 via the delay element 685, the output signal of the NOR gate 683, i.e., control clock D2, goes high upon lapse of the delay time of the delay element 685 from the falling edge of the control clock D1.

On the other hand, when the output of the lock detector goes low (that is, when the phase-lock release is detected), the output signal of the NOR gate 683, i.e., control clock D2, goes low. Since the control clock D2 is input via the delay element 684 to the NOR gate 682, the output signal of the NOR gate 682, i.e., control clock D1, goes high upon lapse of the delay time of the delay element 684 from the falling edge of the control clock D2.

Thus, the control clock signals D1 and D2 do not overlap in terms of pulse duration. The selector 654 can detect the phase-lock release from the control clock D1, and the phase clock from the control clock D2. More precisely, the selector 654 selects the first up-signal 31 and first down-signal 32 if the control clock D1 is high, and selects the second up-signal 33 and second down-signal 34 if the control clock D2 is high.

As shown in, for example, FIG. 23, the selector 654 includes AND gates 691 and 692, an OR gate 693, AND gates 694 and 695, and an OR gate 696.

The AND gate 691 inputs a logical product of the control clock D1 and the first up-signal 31 to the OR gate 693. The AND gate 692 inputs a logical product of the control clock D2 and the second up-signal 33 to the OR gate 693. The OR gate 693 inputs a logical sum of the signals input from the AND gates 691 and 692 to the charge pump 555, as up-signal for controlling the up-current. Therefore, the up-signal becomes the first up-signal 31 if the control clock D1 is high, and becomes the second up-signal 33 if the control clock D2 is high.

The AND gate 694 inputs the logical product of the control clock D1 and the first down-signal 32 to the OR gate 696. The AND gate 695 inputs the logical product of the control clock D2 and the second down-signal 34 to the OR gate 696. The OR gate 696 inputs a logical sum of the signals input from the AND gates 694 and 695 to the charge pump 555, as down-signal for controlling the down-current. Therefore, the down-signal becomes the first down-signal 32 if the control clock D1 is high, and becomes the second down-signal 34 if the control clock D2 is high.

As described above, the output of the lock detector are converted to two control clocks D1 and D2 not overlap in terms of pulse duration, in the phase synchronization circuit according to this embodiment. The selector selects a signal in accordance with the control clocks D1 and D2. The selector never selects, at the same time, the signal output from the phase frequency detector and the signals output from the first and second phase detectors. Therefore, the reference-signal spurious can be prevented from increasing, and the phase-lock release can be avoided.

Seventh Embodiment

Figure 24:
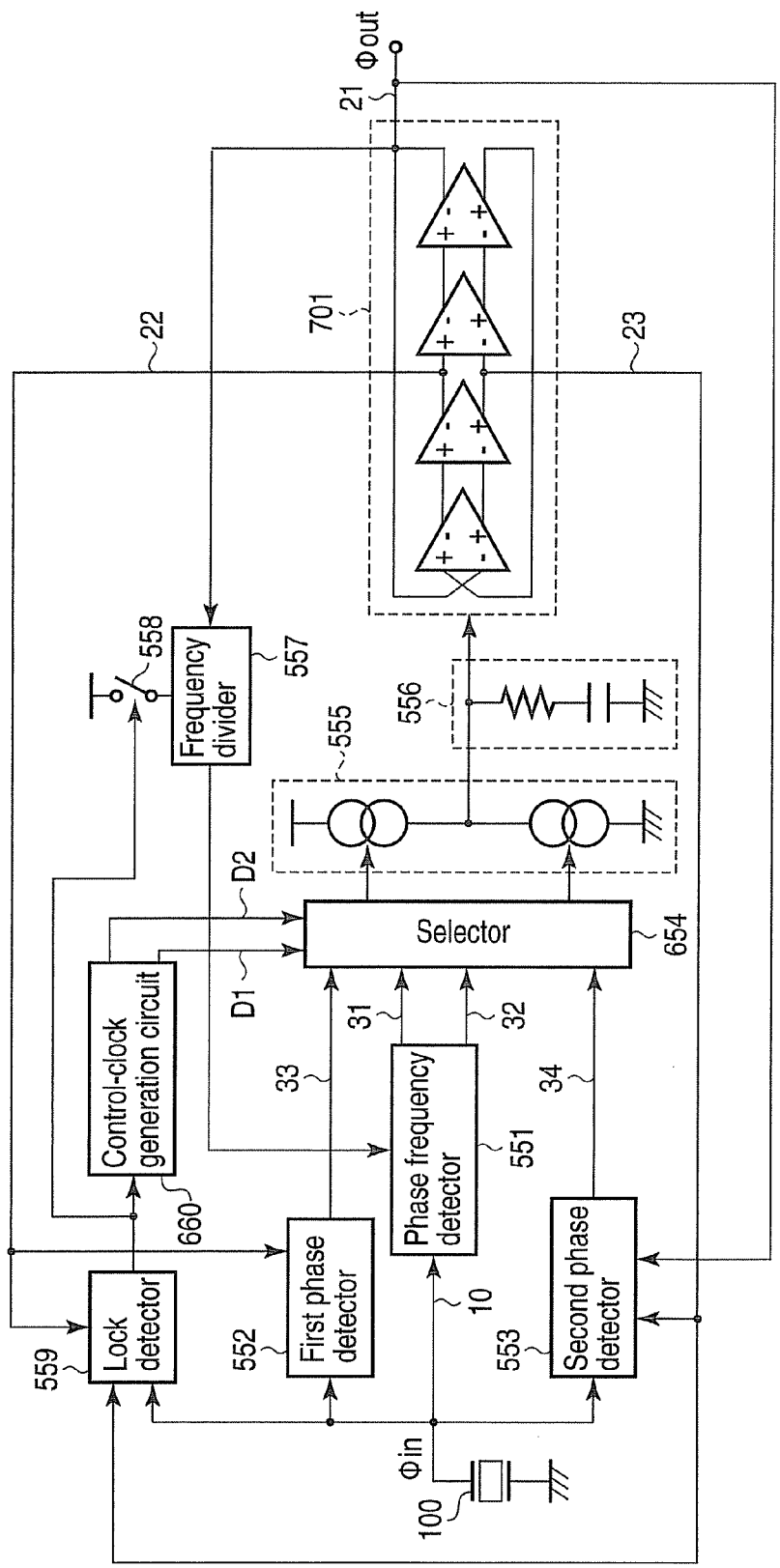
FIG. 24 is a block diagram showing a phase synchronization circuit according to a seventh embodiment.

As shown in FIG. 24, a phase synchronization circuit according to a seventh embodiment of this invention differs from the circuit of FIG. 21 in that a VCO 701 replaces the VCO 501. In FIG. 24, the components identical to those shown in FIG. 21 are designated by the same reference numbers. The components characterizing the seventh embodiment will be described in the main.

The VCO 701 constituted by a ring oscillator comprising a plurality of inverting amplifiers that are circularly connected in cascade. The VCO 701 generates a signal of a frequency that accords with the voltage of the control signal input from the loop filter 556 to the control terminal. The VCO 701 generates multi-phase signals that has various values, the number of which accords with the number of inverting amplifiers used. More specifically, the VCO 701 comprises four inverting amplifiers, and can generate a first phase signal 21, a second phase signal 22 and a third phase signal 23 from any three points, respectively. The phase difference between the first and second phase signals 21, 22 and 23 can be set to any value desirable. Nonetheless, the phase difference should better be greater than the dead zones of the first and second phase detectors 552 and 553.

As indicated above, the phase synchronization circuit according to this embodiment is identical to the circuit according to the sixth embodiment, except that the VCO is a ring oscillator. Thus, the phase synchronization circuit according to this embodiment can generate multi-phase signals, without using a phase shifter.

Eighth Embodiment

Figure 25:
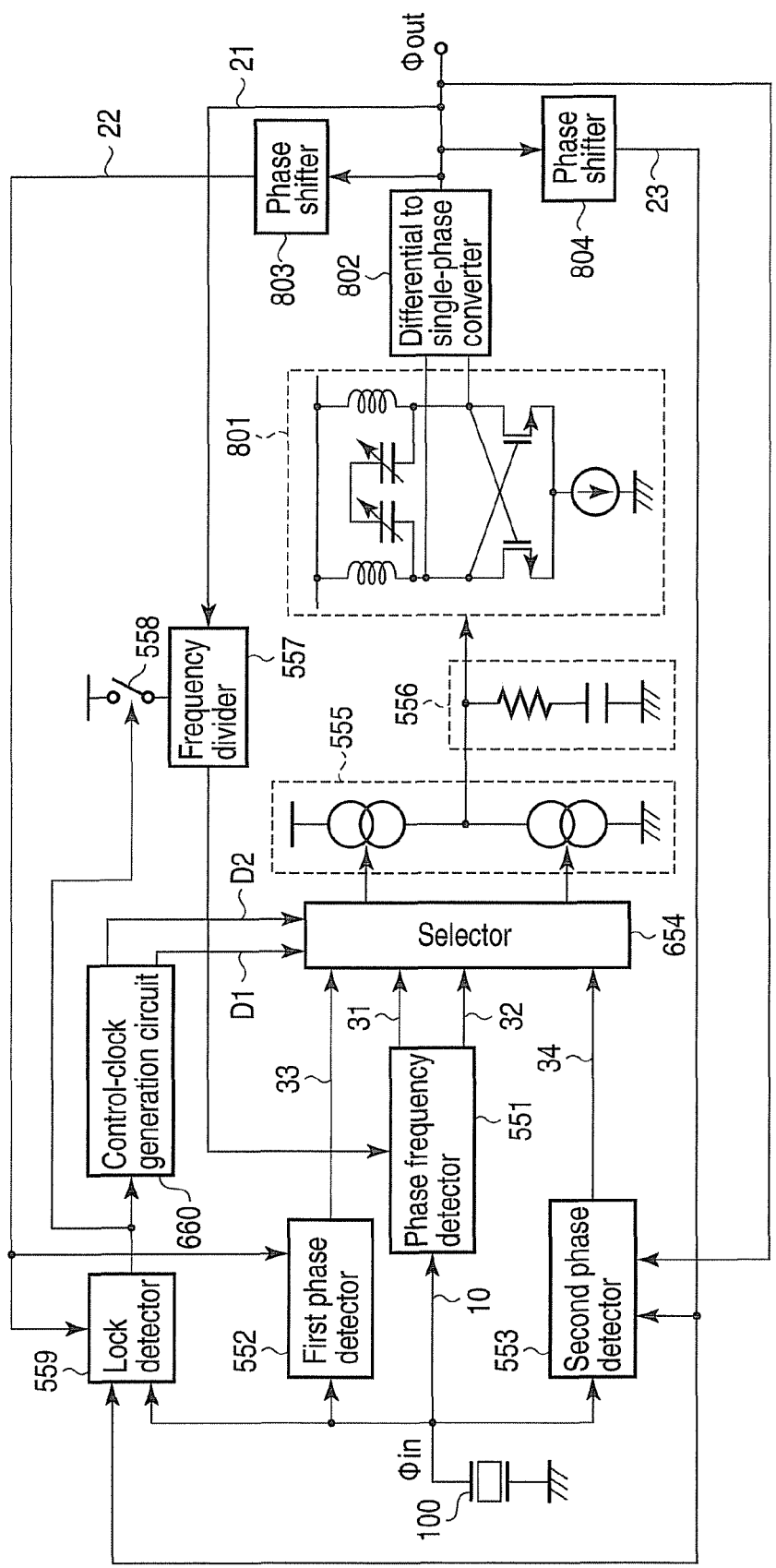
FIG. 25 is a block diagram showing a phase synchronization circuit according to an eighth embodiment.

As shown in FIG. 25, a phase synchronization circuit according to an eighth embodiment of this invention differs from the circuit of FIG. 24 in that a VCO 801, a differential to single-phase converter 802, and phase shifters 803 and 804 replace the VCO 701. In FIG. 25, the components identical to those shown in FIG. 24 are designated by the same reference numbers. The components characterizing the eighth embodiment will be described in the main.

The VCO 801 is constituted by an LC oscillator that includes variable capacitors. The VCO 801 generates, but less noise than the VCO 701 described above. In the VCO 801, the capacitances of the variable capacitors are controlled by the control signal input from the loop filter 556 to the control terminal. The VCO 801 generates differential oscillation signal having a common oscillation frequency that accords with the voltage of the control signal. The differential oscillation signals are output to the differential to single-phase converter 802. Unlike the VCO 501 and VCO 701, the VCO 801 cannot generate multi-phase signals.

The differential to single-phase converter 802 receives differential oscillation signals from the VCO 801 and converts this signal to a single-phase oscillation signal. The singe-phase oscillation signal is input as first phase signal 21 to the second phase detector 553, frequency divider 557 and phase shifters 803 and 804.

The phase shifter 803 delays the phase of the first phase signal 21 by a prescribed value (ΔT), generating a second phase signal 22. The second phase signal 22 is input to the first phase detector 552 and the lock detector 559. The phase shifter 804 advances the phase of the first phase signal 21 by a predetermined value (ΔT), generating a third phase signal 23. The third phase signal 23 is input to the second phase detector 553 and the lock detector 559. It is desired that the predetermined value (ΔT) should be greater than the dead zone of the first and second phase detectors 552 and 553.

As pointed out above, the LC oscillator replaces the VCO used in the seventh embodiment, in the phase synchronization circuit according to the present embodiment. Therefore, the circuit according to this invention can further reduce the phase noise produced in the VCO.

Ninth Embodiment

As shown in FIG. 26, a phase synchronization circuit according to a ninth embodiment of this invention differs from the circuit of FIG. 24 in that a VCO 901 replaces the VCO 701. In FIG. 26, the components identical to those shown in FIG. 24 are designated by the same reference numbers. The components characterizing the ninth embodiment will be described in the main.

The VCO 901 comprises an orthogonal oscillator and first and second operational amplifiers. The orthogonal oscillator comprises first and second LC oscillators connected, forming a ring. The first and second LC oscillators include variable capacitors each. The first and second operational amplifiers perform differential to single-phase conversion on the outputs of the first and second LC oscillators, respectively. The VCO 901 generates, but less noise than the VCO 701 described above. In the VCO 901, the control signal input from the loop filter 556 to the control terminal controls the variable capacitors in terms of capacitance. Thus, in the VCO 901, the first LC oscillator generates the first differential oscillation signals having a common oscillation frequency that accords with the voltage of the control signal, and the second LC oscillator generates the second differential oscillation signals differ in phase by 90° from the first differential oscillation signals.

The first operational amplifier converts the first differential oscillation signals to a single-phase signal, which is output as first phase signal 21 to the second phase detector 553 and the frequency divider 557. The second operational amplifier converts the second differential oscillation signals to a single-phase signal, which is output as second phase signal 22 to the first phase detector 552 and the lock detector 559. The second differential oscillation signals are input to a third operational amplifier, too. The third operational amplifier generates a third phase signal 23 obtained by inverting the second phase signal 22. The third phase signal 23 is output to the second phase detector 553 and the lock detector 559.

Hence, the phase difference between the first and second phase signals 21 and 22 and the phase difference between the first and third phase signals 21 and 23 are both 90°. These phase differences are much larger than the dead zones of the first and second phase detectors 552 and 553. This prevents a decrease in the phase-noise characteristic of the PLL, in spite of the dead zones of the first and second phase detectors 552 and 553.

As described above, the phase synchronization circuit according to this embodiment is identical to the circuit according to the seventh embodiment, except that the VCO is an orthogonal oscillator comprising LC oscillators. Thus, the phase synchronization circuit according to this embodiment can further reduce the phase noise generated in the VCO. Moreover, the circuit need not have a phase shifter, unlike the phase synchronization circuit according to the eighth embodiment.

Tenth Embodiment

As shown in FIG. 27, a receiver according to a tenth embodiment of the present invention has an antenna 1000, a duplexer 1001, a low-noise amplifier (LNA) 1002, a local oscillator 1003, a 90°-phase shifter 1004, a digital signal processing unit 1005, a mixer 1011, an LPF 1012, a automatic gain control (AGC) circuit 1013, an analog-to-digital converter (ADC) 1014, a mixer 1021, an LPF 1022, an ADC 1024, and a clock generation circuit 1030.

The antenna 1000 receives a radio-frequency (RF) signal, which is input to the duplexer 1001. The duplexer 1001 suppresses unnecessary waves of the RF signal. The RF signal is supplied to the LNA 1002. The LNA 1002 amplifies the RF signal and supplies the same to the mixers 1011 and 1021.

The local oscillator 1003 generates a local signal for achieving down-conversion of the RF signal. The local signal is input to the mixer 1011 and the 90°-phase shifter 1004. The 90°-phase shifter 1004 shifts the local signal in terms of phase and inputs the same to the mixer 1021.

The mixer 1011 performs multiplication on the RF signal output from the LNA 1002 and the local signal output from the local oscillator 1003, generating an I signal. The mixer 1021 performs multiplication on the RF signal and the local signal phase-shifted by the 90°-phase shifter 1004, generating a Q signal.

The LPF 1012 suppresses high-frequency components of the I signal generated by the mixer 1011. The LPF 1022 suppresses high-frequency components of the Q signal generated by the mixer 1021. The AGC 1013 adjusts the level of the I signal, and the AGC 1023 adjusts the level of the Q signal. The ADCs 1014 and 1024 sample the I signal and the Q signal, respectively, in accordance with a sampling clock generated by the clock generation circuit 1030. Thus, the ADCs 1014 and 1024 generate digital values. The digital values are input to the digital signal processing unit 1005. The clock generation circuit 1030 is constituted by a phase synchronization circuit according to any one of the first to ninth embodiments described above.

The digital signal processing unit 1005 is constituted by, for example, a digital signal processor (DSP). The digital signal processing unit 1005 can process the digital signals I and Q supplied from the ADCs 1014 and 1024, respectively, decoding or reproducing the data transmitted from a transmitter (not shown).

As indicated above, the receiver according to this embodiment incorporates a clock generation circuit that generates a sampling clock for converting the I signal and the Q signal. The clock generation circuit is a phase synchronization circuit according to any one of the first to ninth embodiments described above. The receiver can therefore generate a high-precision, low-jitter sampling clock.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A phase synchronization circuit comprising:
a controlled oscillator configured to generate a first oscillation signal and a second oscillation signal that have a common frequency but different phase controlled by a combination of a first control signal and a second control signal;
a digital phase frequency detector configured to detect a frequency difference and a first phase difference between a reference signal and the first oscillation signal to generate a first detection signal that accords with the frequency difference and the first phase difference;
a digital filter configured to suppress high-frequency components of the first detection signal to obtain the first control signal;
an analog phase detector configured to detect a second phase difference between the second oscillation signal and the reference signal to generate a second detection signal that accords with the second phase difference;
an analog filter configured to perform a filtering process to suppress high-frequency components of the second detection signal to obtain a filtered signal;
an amplifier configured to amplify the filtered signal to obtain the second control signal; and
a lock detection unit configured to detect a lock of the first oscillation signal with the reference signal in terms of frequency and phase, in order to set the analog phase detector, the analog filter and the amplifier in an active state.

2. The circuit according to claim 1, wherein the controlled oscillator, the digital phase frequency detector and the digital filter constitute a first loop having a first loop band, and the controlled oscillator, the analog phase detector and the amplifier constitute a second loop having a second loop band wider than the first loop band.

3. The circuit according to claim 1, wherein the analog phase detector detects a time difference between the rising edges or falling edges of the second oscillation signal and the reference signal, and generates, as the second detection signal, a voltage pulse that accords with the time difference.

4. The circuit according to claim 1, wherein the analog phase detector detects a time difference between the rising edges or falling edges of the second oscillation signal and the reference signal, and generates, as the second detection signal, a logical product of the first oscillation signal and a voltage pulse that accords with the time difference.

5. The circuit according to claim 1, wherein the analog phase detector detects a time difference between the rising edges or falling edges of the second oscillation signal and the reference signal, and generates, as the second detection signal, an exclusive OR of the first oscillation signal and a voltage pulse that accords with the time difference.

6. The circuit according to claim 1, wherein the controlled oscillator is an orthogonal oscillator that generates the first oscillation signal and the second oscillation signal that is orthogonal to the first oscillation signal.

7. A phase synchronization circuit comprising:
a ring oscillator configured to generate a first oscillation signal and a second oscillation signal that have a common frequency but different phase controlled by a combination of a first control signal and a second control signal;
a digital phase frequency detector configured to detect a frequency difference and a first phase difference between a reference signal and the first oscillation signal to generate a first detection signal that accords with the frequency difference and the first phase difference;

a digital filter configured to suppress high-frequency components of the first detection signal to obtain a first filtered signal;
a digital-to-analog converter configured to convert the first filtered signal to an analog signal to obtain the first control signal;
an analog phase detector configured to detect a second phase difference between the second oscillation signal and the reference signal to generate a second detection signal that accords with the second phase difference;
an analog filter configured to perform a filtering process to suppress high-frequency components of the second detection signal to obtain a second filtered signal;
an amplifier configured to amplify the second filtered signal to obtain the second control signal; and
a lock detection unit configured to detect a lock of the first oscillation signal with the reference signal in terms of frequency and phase, in order to set the analog phase detector, the analog filter and the amplifier in an active state.

8. A phase synchronization circuit comprising:
a controlled oscillator configured to generate a first oscillation signal having a frequency controlled by a combination of a first control signal and a second control signal;
a phase shifter configured to shift the first oscillation signal in terms of phase to obtain a second oscillation signal;
a digital phase frequency detector configured to detect a frequency difference and a first phase difference between the first oscillation signal and a reference signal to generate a first detection signal that accords with the frequency difference and the first phase difference;
a digital filter configured to perform a filtering process to suppress high-frequency components of the first detection signal to obtain the first control signal;
an analog phase detector configured to detect a second phase difference between the second oscillation signal and the reference signal to generate a second detection signal that accords with the second phase difference;
an analog filter configured to perform a filtering process to suppress high-frequency components of the second detection signal to obtain a filtered signal;
an amplifier configured to amplify the filtered signal to obtain the second control signal; and
a lock detection unit configured to detect a lock of the first oscillation signal with the reference signal in terms of frequency and phase, in order to set the analog phase detector, the analog filter and the amplifier in an active state.

9. The circuit according to claim 8, wherein the controlled oscillator is an LC oscillator.

10. A phase synchronization circuit comprising:
a controlled oscillator configured to generate a first oscillation signal and a second oscillation signal that have a common frequency but different phase controlled by a control signal;
a lock detection unit configured to detect whether a reference signal and the first oscillation signal are in lock condition or unlocked condition;
a frequency divider configured to frequency-divide the first oscillation signal in the unlocked condition to obtain a frequency-divided signal;
a phase frequency detector configured to detect a frequency difference and a first phase difference between the reference signal and the frequency-divided signal to generate a first detection signal that accords with the frequency difference and the first phase difference;
a phase detector configured to detect a second phase difference between the second oscillation signal and the reference signal to generate a second detection signal that accords with the second phase difference;
a selector configured to select the first detection signal in the unlocked condition and to select the second detection signal in the locked condition in order to obtain a selected detection signal; and
a filter configured to perform a filtering process to suppress high-frequency components of the selected detection signal to obtain the control signal.

11. The circuit according to claim 10, wherein the phase detector detects a time difference between the rising edges or falling edges of the second oscillation signal and the reference signal, and generates, as the second detection signal, a voltage pulse that accords with the time difference.

12. The circuit according to claim 10, further comprising a control clock generating circuit configured to generate a first control clock and a second control clock based on a detection result signal of the lock detection unit and to input the first control clock and the second control clock to the selector, the first control clock representing the locked condition, and the second control clock representing the unlocked condition and not overlapping the first control clock.

13. The circuit according to claim 12, wherein the control clock generating circuit generates the first control clock and second control clock that are delayed with respect to at least one of the rising edges and the falling edges of the detection result signal.

14. The circuit according to claim 10, wherein the controlled oscillator is a ring oscillator.

15. The circuit according to claim 10, wherein the controlled oscillator includes:
an LC oscillator configured to output a first oscillation signal that accords with the control signal; and
a phase shifter configured to shift the first control signal in phase to generate the second oscillation signal.

16. The circuit according to claim 10, wherein the controlled oscillator is an orthogonal oscillator that generates the first oscillation signal and the second oscillation signal that is orthogonal to the first oscillation signal.

17. A receiver including:
a clock generating unit including the circuit according to claim 1 and configured to generate a clock signal controlled by the first oscillation signal; and
an analog-to-digital converter configured to operate in accordance with the clock signal.

* * * * *